United States Patent
Yoneda

(10) Patent No.: US 10,680,110 B2
(45) Date of Patent: Jun. 9, 2020

(54) SEMICONDUCTOR DEVICE AND DISPLAY DEVICE INCLUDING THE SAME

(71) Applicant: Semiconductor Energy Laboratory Co., Ltd., Atsugi-shi, Kanagawa-ken (JP)

(72) Inventor: Seiichi Yoneda, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/002,435

(22) Filed: Jun. 7, 2018

(65) Prior Publication Data
US 2018/0294349 A1    Oct. 11, 2018

Related U.S. Application Data

(63) Continuation of application No. 13/710,929, filed on Dec. 11, 2012, now Pat. No. 10,002,968.

(30) Foreign Application Priority Data

Dec. 14, 2011    (JP) .................................. 2011-273413

(51) Int. Cl.
*H01L 29/786*    (2006.01)
*H01L 27/12*    (2006.01)

(52) U.S. Cl.
CPC ........ *H01L 29/786* (2013.01); *H01L 27/1225* (2013.01)

(58) Field of Classification Search
CPC ... H01L 27/1214–1296; H01L 27/3248–3262; H01L 29/4908;
(Continued)

(56) References Cited

U.S. PATENT DOCUMENTS

| 4,555,721 A | 11/1985 | Bansal et al. |
| 5,095,347 A | 3/1992 | Kirsch |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543

(Continued)

*Primary Examiner* — Cuong B Nguyen
(74) *Attorney, Agent, or Firm* — Robinson Intellectual Property Law Office; Eric J. Robinson

(57) ABSTRACT

A first transistor and a second transistor are stacked. The first transistor and the second transistor have a gate electrode in common. At least one of semiconductor films used in the first transistor and the second transistor is an oxide semiconductor film. With the use of the oxide semiconductor film as the semiconductor film in the transistor, high field-effect mobility and high-speed operation can be achieved. Since the first transistor and the second transistor are stacked and have the gate electrode in common, the area of a region where the transistors are disposed can be reduced.

19 Claims, 12 Drawing Sheets

(58) Field of Classification Search
CPC .......... H01L 51/0508; H01L 2021/775; H01L 29/7869–78693; H01L 29/742; H01L 2224/25174; H01L 2225/06503; H01L 21/8221; H01L 21/8232
See application file for complete search history.

(56) References Cited

U.S. PATENT DOCUMENTS

| | | |
|---|---|---|
| 5,100,817 A | 3/1992 | Cederbaum et al. |
| 5,208,476 A | 5/1993 | Inoue |
| 5,341,327 A | 8/1994 | Kuriyama |
| 5,374,564 A | 12/1994 | Bruel |
| 5,396,083 A | 3/1995 | Kim et al. |
| 5,567,959 A * | 10/1996 | Mineji .............. H01L 27/0688 257/350 |
| 5,569,936 A | 10/1996 | Zhang et al. |
| 5,585,647 A | 12/1996 | Nakajima et al. |
| 5,637,187 A | 6/1997 | Takasu et al. |
| 5,648,277 A | 7/1997 | Zhang et al. |
| 5,731,856 A | 3/1998 | Kim et al. |
| 5,744,824 A | 4/1998 | Kousai et al. |
| 5,744,864 A | 4/1998 | Cillessen et al. |
| 5,949,092 A | 9/1999 | Kadosh et al. |
| 6,127,702 A | 10/2000 | Yamazaki et al. |
| 6,169,292 B1 | 1/2001 | Yamazaki et al. |
| 6,271,101 B1 | 8/2001 | Fukunaga |
| 6,294,274 B1 | 9/2001 | Kawazoe et al. |
| 6,335,231 B1 | 1/2002 | Yamazaki et al. |
| 6,380,046 B1 | 4/2002 | Yamazaki |
| 6,380,559 B1 | 4/2002 | Park et al. |
| 6,388,652 B1 | 5/2002 | Yamazaki et al. |
| 6,469,890 B1 | 10/2002 | Gan |
| 6,506,635 B1 | 1/2003 | Yamazaki et al. |
| 6,563,174 B2 | 5/2003 | Kawasaki et al. |
| 6,586,286 B2 | 7/2003 | Park et al. |
| 6,649,980 B2 | 11/2003 | Noguchi |
| 6,686,623 B2 | 2/2004 | Yamazaki |
| 6,727,522 B1 | 4/2004 | Kawasaki et al. |
| 6,908,797 B2 | 6/2005 | Takano |
| 6,964,890 B1 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,101,740 B2 | 9/2006 | Young |
| 7,105,868 B2 | 9/2006 | Nause et al. |
| 7,119,365 B2 | 10/2006 | Takafuji et al. |
| 7,205,640 B2 | 4/2007 | Yoshioka et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| RE40,162 E | 3/2008 | Park et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,492,361 B2 | 2/2009 | Kawachi et al. |
| 7,501,293 B2 | 3/2009 | Ito et al. |
| 7,508,034 B2 | 3/2009 | Takafuji et al. |
| 7,619,250 B2 | 11/2009 | Takafuji et al. |
| 7,674,650 B2 | 3/2010 | Akimoto et al. |
| 7,732,819 B2 | 6/2010 | Akimoto et al. |
| 7,737,923 B2 | 6/2010 | Shishido |
| 7,791,072 B2 | 9/2010 | Kumomi et al. |
| 7,863,611 B2 | 1/2011 | Abe et al. |
| 7,884,367 B2 | 2/2011 | Takafuji et al. |
| 7,928,938 B2 | 4/2011 | Osame et al. |
| RE42,670 E | 9/2011 | Park et al. |
| 8,049,253 B2 | 11/2011 | Isobe |
| 8,203,146 B2 | 6/2012 | Abe et al. |
| 8,237,166 B2 | 8/2012 | Kumomi et al. |
| 8,247,813 B2 | 8/2012 | Koyama et al. |
| 8,278,162 B2 | 10/2012 | Akimoto et al. |
| 8,314,032 B2 | 11/2012 | Kawamura et al. |
| 8,354,674 B2 | 1/2013 | Kimura |
| 8,378,403 B2 | 2/2013 | Kato |
| 8,470,688 B2 | 6/2013 | Isobe |
| 8,669,550 B2 | 3/2014 | Akimoto et al. |
| 8,704,221 B2 | 4/2014 | Yoneda et al. |
| 8,809,850 B2 | 8/2014 | Yamazaki |
| 8,841,730 B2 | 9/2014 | Isobe |
| 8,866,138 B2 | 10/2014 | Koyama et al. |
| 8,901,559 B2 | 12/2014 | Yamazaki |
| 9,064,473 B2 | 6/2015 | Takemura |
| 9,209,251 B2 | 12/2015 | Yamazaki |
| 9,293,594 B2 | 3/2016 | Nishimura et al. |
| 9,508,742 B2 | 11/2016 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0030054 A1 | 2/2003 | Hector et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017247 A1 | 1/2005 | Koo et al. |
| 2005/0017302 A1 | 1/2005 | Hoffman |
| 2005/0199959 A1 | 9/2005 | Chiang et al. |
| 2005/0275018 A1 | 12/2005 | Venkatesan et al. |
| 2005/0275038 A1 | 12/2005 | Shih et al. |
| 2006/0012729 A1 | 1/2006 | Tanaka et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0194384 A1 | 8/2006 | Venkatesan et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0087488 A1 | 4/2007 | Moriwaka |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0181953 A1 | 8/2007 | Lyu et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054319 A1 | 3/2008 | Mouli |
| 2008/0073653 A1 | 3/2008 | Iwasaki |
| 2008/0083950 A1 | 4/2008 | Pan et al. |
| 2008/0090344 A1 | 4/2008 | Kuwabara et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |

(56) References Cited

U.S. PATENT DOCUMENTS

| | | |
|---|---|---|
| 2008/0182358 A1 | 7/2008 | Cowdery-Corvan et al. |
| 2008/0218652 A1 | 9/2008 | Kim et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0014799 A1 | 1/2009 | Isobe |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0212286 A1 | 8/2009 | Benzarti |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0127253 A1 | 5/2010 | Inoue et al. |
| 2010/0140608 A1 | 6/2010 | Park et al. |
| 2010/0176395 A1 | 7/2010 | Choi et al. |
| 2010/0182223 A1 | 7/2010 | Choi et al. |
| 2010/0193785 A1 | 8/2010 | Kimura |
| 2011/0156027 A1 | 6/2011 | Yamazaki et al. |
| 2011/0279419 A1 | 11/2011 | Takemura |
| 2012/0007085 A1 | 1/2012 | Suzuki et al. |
| 2012/0018808 A1 | 1/2012 | Isobe |
| 2012/0052625 A1 | 3/2012 | Yamazaki |
| 2012/0063208 A1 | 3/2012 | Koyama et al. |
| 2012/0273774 A1 | 11/2012 | Noda |
| 2013/0140569 A1 | 6/2013 | Yoneda et al. |
| 2013/0161607 A1 | 6/2013 | Yoneda et al. |
| 2013/0161713 A1 | 6/2013 | Yamazaki et al. |
| 2013/0214279 A1 | 8/2013 | Nishimura et al. |
| 2015/0021600 A1 | 1/2015 | Koyama et al. |
| 2015/0179806 A1 | 6/2015 | Yoneda et al. |

FOREIGN PATENT DOCUMENTS

| | | |
|---|---|---|
| JP | 60-198861 A | 10/1985 |
| JP | 63-102264 A | 5/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-149478 A | 6/1989 |
| JP | 01-246863 A | 10/1989 |
| JP | 05-251705 A | 9/1993 |
| JP | 06-013606 A | 1/1994 |
| JP | 06-196697 A | 7/1994 |
| JP | 06-291269 A | 10/1994 |
| JP | 07-094743 A | 4/1995 |
| JP | 07-193251 A | 7/1995 |
| JP | 08-148693 A | 6/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-066639 A | 3/2001 |
| JP | 2002-076356 A | 3/2002 |
| JP | 2002-184993 A | 6/2002 |
| JP | 2002-289859 A | 10/2002 |
| JP | 2003-086010 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-096126 A | 4/2007 |
| JP | 2009-038368 A | 2/2009 |
| JP | 2010-003910 A | 1/2010 |
| JP | 2010-040815 A | 2/2010 |
| JP | 2010-283338 A | 12/2010 |
| JP | 2011-139056 A | 7/2011 |
| JP | 2011-142314 A | 7/2011 |
| JP | 2011-151383 A | 8/2011 |
| WO | WO-2003/094244 | 11/2003 |
| WO | WO-2004/114391 | 12/2004 |
| WO | WO-2006/001915 | 1/2006 |
| WO | WO-2011/068017 | 6/2011 |
| WO | WO-2011/070928 | 6/2011 |
| WO | WO-2011/135908 | 11/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860- 863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191- 194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch VGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide Tfts", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZNO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41- 44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID Internation Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3—A2O3—BO Systems [A; Fe. Ga, or Al; B: Mg, Mn, Fe, Ni, Cu,or Zn]at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Lee.D et al., "A General Route to Printable High-Mobility Transparent Amorphous Oxide Semiconductors", Adv. Mater. (Advanced Materials), 2007, vol. 19, No. 6, pp. 843-847.

\* cited by examiner

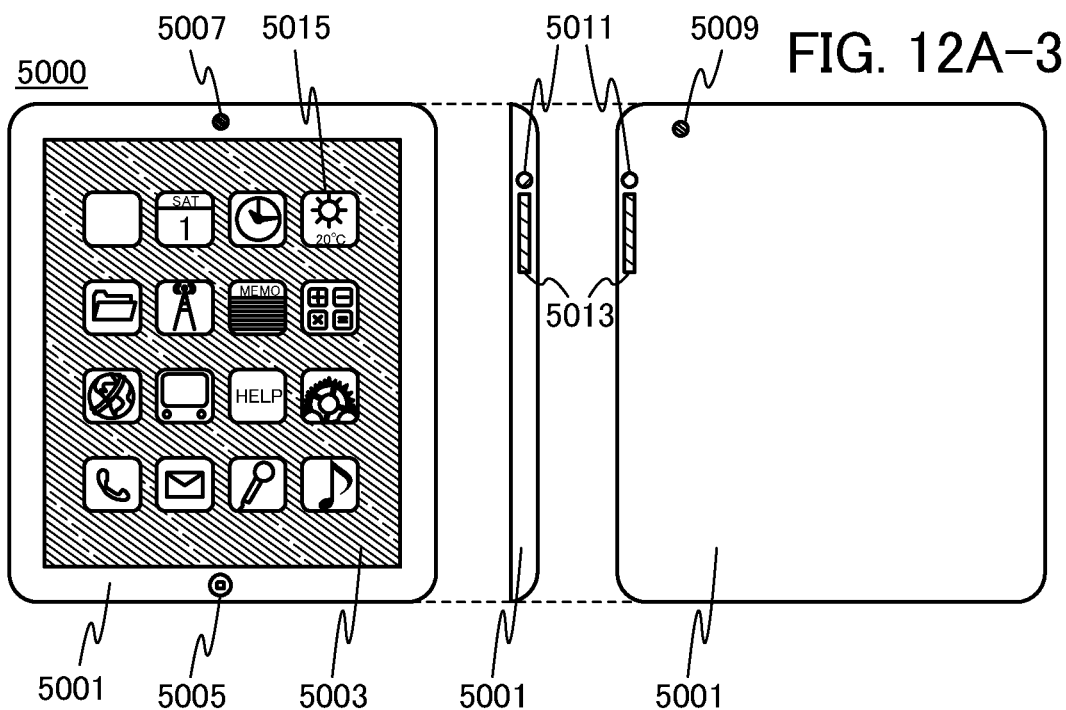
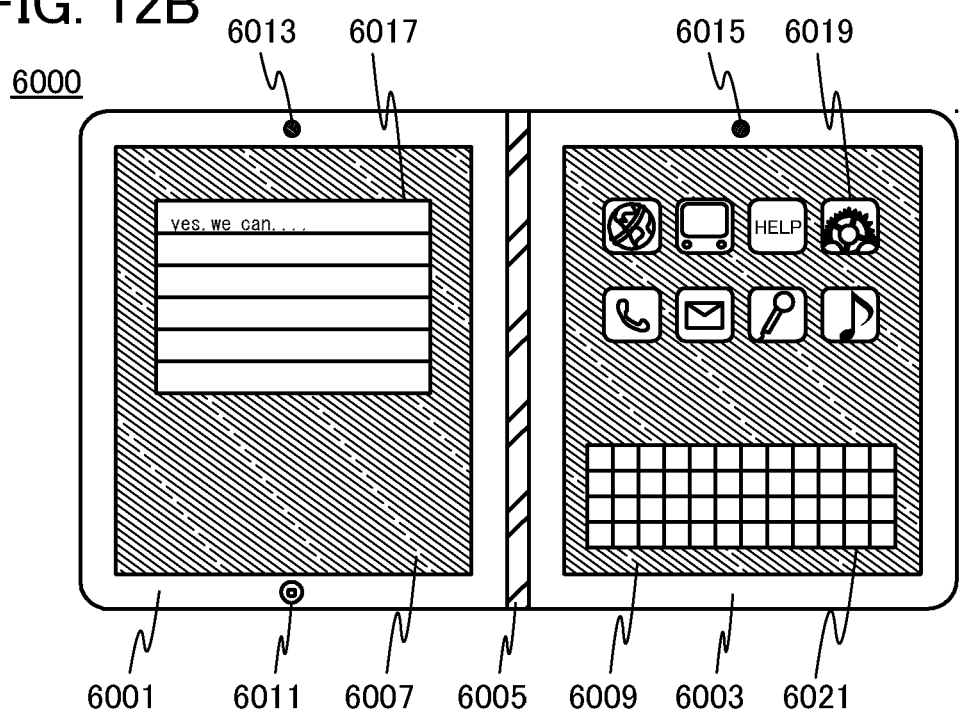

SEMICONDUCTOR DEVICE AND DISPLAY DEVICE INCLUDING THE SAME

BACKGROUND OF THE INVENTION

1. Field of the Invention

One embodiment of the disclosed invention relates to a semiconductor device and a display device including the semiconductor device.

2. Description of the Related Art

Attention has been focused on a technique for forming a transistor (also referred to as thin film transistor (TFT)) using a semiconductor thin film formed over a substrate having an insulating surface. The transistor is applied to a wide range of electronic devices such as an integrated circuit (IC) and an image display device (display device).

A technique for forming a pixel portion and a driver circuit portion using transistors over the same substrate in a display device has been actively developed.

A silicon-based semiconductor material is widely known as a material for a semiconductor thin film applicable to a transistor. As another material for a semiconductor thin film, an oxide semiconductor material has been attracting attention.

For example, a transistor whose active layer includes an amorphous oxide containing indium (In), gallium (Ga), and zinc (Zn) and having an electron carrier concentration lower than $10^{18}/cm^3$ is disclosed (see Patent Document 1).

REFERENCE

Patent Document

[Patent Document 1] Japanese Published Patent Application No. 2006-165528

SUMMARY OF THE INVENTION

A transistor is thus suitably used for a display device; the number of transistors performing switching of pixels is increased when the number of pixels is increased with an increase in the resolution of a display device. When the number of the transistors is increased, the area of a region where the transistors are disposed is increased and thus the aperture ratio is reduced; accordingly, it is difficult to achieve higher resolution of the display device.

With an increase in the resolution of the display device, the transistors performing switching of the pixels are required to operate at high speed.

In view of such problems, an object is to provide a semiconductor device in which the area of a region where transistors are disposed is reduced. Another object is to provide a semiconductor device including transistors capable of high-speed operation.

Another object is to achieve higher resolution of a display device including the semiconductor device by reducing the area of the region where the transistors are disposed and improving the aperture ratio.

In a semiconductor device including transistors, high-speed operation is achieved and the area of a region where the transistors are disposed is reduced. Specifically, a first transistor and a second transistor are stacked; the first transistor and the second transistor have a gate electrode in common; and at least one of semiconductor films used in the first transistor and the second transistor is an oxide semiconductor film. With the use of the oxide semiconductor film as the semiconductor film in the transistor, high field-effect mobility and high-speed operation can be achieved. Since the first transistor and the second transistor are stacked and have the gate electrode in common, the area of a region where the transistors are disposed can be reduced. The details will be given below.

One embodiment of the disclosed present invention is a semiconductor device including a first transistor and a second transistor. The first transistor includes a first semiconductor film; a first source electrode and a first drain electrode over the first semiconductor film; a first gate insulating film over the first semiconductor film; and a gate electrode which is in contact with the first gate insulating film and overlaps with the first semiconductor film. The second transistor includes a second gate insulating film over the gate electrode; a second semiconductor film which is in contact with the second gate insulating film and overlaps with the gate electrode; and a second source electrode and a second drain electrode over the second semiconductor film. The first transistor and the second transistor are stacked. At least one of the first semiconductor film and the second semiconductor film is an oxide semiconductor film.

Another embodiment of the disclosed present invention is a semiconductor device including a first transistor and a second transistor. The first transistor includes a first semiconductor film; a first source electrode and a first drain electrode over the first semiconductor film; a first gate insulating film over the first semiconductor film; and a gate electrode which is in contact with the first gate insulating film and overlaps with the first semiconductor film. The second transistor includes a second gate insulating film over the gate electrode; a second semiconductor film which is in contact with the second gate insulating film and overlaps with the gate electrode; an insulating film over the second semiconductor film; and a second source electrode and a second drain electrode which are over the insulating film and are electrically connected to the second semiconductor film. The first transistor and the second transistor are stacked. At least one of the first semiconductor film and the second semiconductor film is an oxide semiconductor film.

Another embodiment of the disclosed present invention is a semiconductor device including a first transistor and a second transistor. The first transistor includes a first source electrode and a first drain electrode; a first semiconductor film over the first source electrode and the first drain electrode; a first gate insulating film over the first semiconductor film; and a gate electrode which is in contact with the first gate insulating film and overlaps with the first semiconductor film. The second transistor includes a second gate insulating film over the gate electrode; a second source electrode and a second drain electrode over the second gate insulating film; and a second semiconductor film which is in contact with the second gate insulating film, overlaps with the gate electrode, and is electrically connected to the second source electrode and the second drain electrode. The first transistor and the second transistor are stacked. At least one of the first semiconductor film and the second semiconductor film is an oxide semiconductor film.

In each of the above structures, an interlayer insulating film is preferably provided between the first transistor and the second transistor. Further, a protective insulating film is preferably provided over the second semiconductor film.

By providing the interlayer insulating film between the first transistor and the second transistor, coverage with the second gate insulating film used in the second transistor can be improved. Further, by providing the protective insulating film over the second semiconductor film, impurities attaching to the second semiconductor film at the time of formation of the second source electrode and the second drain electrode can be reduced and thus the reliability of the second transistor can be improved.

In each of the above structures, the oxide semiconductor film preferably contains at least one of oxides of indium, zinc, gallium, zirconium, tin, gadolinium, titanium, and cerium. Further, it is preferable that the oxide semiconductor film include crystal parts, and c-axes of the crystal parts be aligned in a direction parallel to a normal vector of a surface where the oxide semiconductor film is formed.

With the use of such an oxide semiconductor film, a semiconductor device which has high field-effect mobility and is capable of high-speed operation can be achieved.

The energy gap of the oxide semiconductor film disclosed in this specification and the like is 2.8 eV to 3.2 eV, which is greater than that of silicon (1.1 eV). The minor carrier density of the oxide semiconductor film is $1\times10^{-9}/cm^3$, which is much smaller than the intrinsic carrier density of silicon ($1\times10^{11}/cm^3$).

Majority carriers (electrons) of the oxide semiconductor film flow only from a source of a transistor. Further, a channel formation region can be depleted completely. Thus, off-state current of the transistor can be extremely small. The off-state current of the transistor including the oxide semiconductor film is as small as 10 yA/μm or less at room temperature, and 1 yA/μm or less at 85° C. to 95° C.

Accordingly, a transistor including an oxide semiconductor film has a small S value, so that an ideal S value can be obtained. Further, such a transistor has high reliability.

In each of the above structures, the first transistor and the second transistor each can serve as a pixel switching element.

Another embodiment of the present invention is a display device including a semiconductor device having the above structure.

In particular, by using a semiconductor device having the above structure as pixel switching elements in a pixel portion, the aperture ratio can be improved and thus higher resolution can be achieved.

A semiconductor device in which the area of a region where transistors are disposed is reduced can be provided. Further, a semiconductor device including transistors capable of high-speed operation can be provided. Furthermore, in a display device including the semiconductor device, the area of the region where the transistors are disposed can be reduced, the aperture ratio can be improved, and higher resolution can be achieved.

BRIEF DESCRIPTION OF THE DRAWINGS

FIGS. 12A-1 to 12A-3 and 12B illustrate electronic devices.

DETAILED DESCRIPTION OF THE INVENTION

Figure 1A:
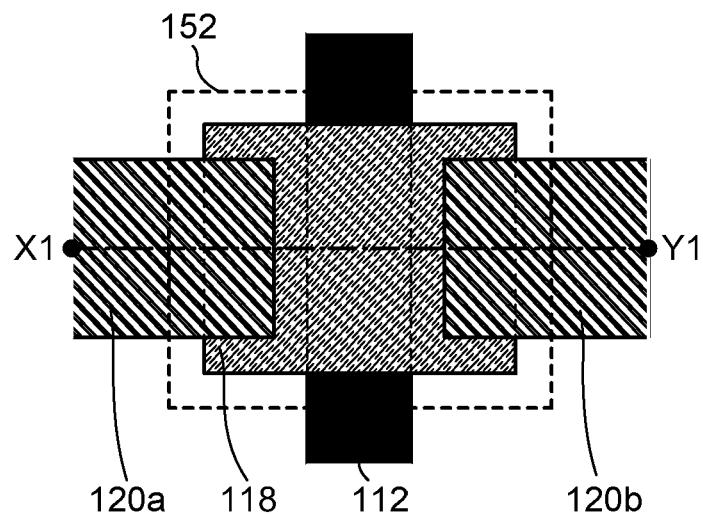
FIGS. 1A and 1B are a top view and a cross-sectional view illustrating one embodiment of a semiconductor device.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, size, range, or the like of each structure illustrated in drawings and the like is not accurately represented in some cases for easy understanding. Therefore, the disclosed invention is not necessarily limited to the position, size, range, or the like disclosed in the drawings and the like.

In this specification and the like, ordinal numbers such as "first", "second", and "third" are used in order to avoid confusion among components, and the terms do not limit the components numerically.

Note that in this specification and the like, the term "over" or "below" does not necessarily mean that a component is placed "directly on" or "directly under" another component. For example, the expression "a gate electrode over a gate insulating film" can mean the case where there is an additional component between the gate insulating film and the gate electrode.

In addition, in this specification and the like, the term "electrode" or "wiring" does not limit a function of a component. For example, an "electrode" is sometimes used as part of a "wiring", and vice versa. Further, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object. Examples of an object having any electric function are a switching element such as a transistor, a resistor, an inductor, a capacitor, and an element with a variety of functions as well as an electrode and a wiring.

Embodiment 1

In this embodiment, one embodiment of a semiconductor device and a method of manufacturing the semiconductor device will be described with reference to FIGS. 1A and 1B, FIGS. 2A to 2D, and FIGS. 3A to 3D.

<Structural Example of Semiconductor Device>

Figure 1B:
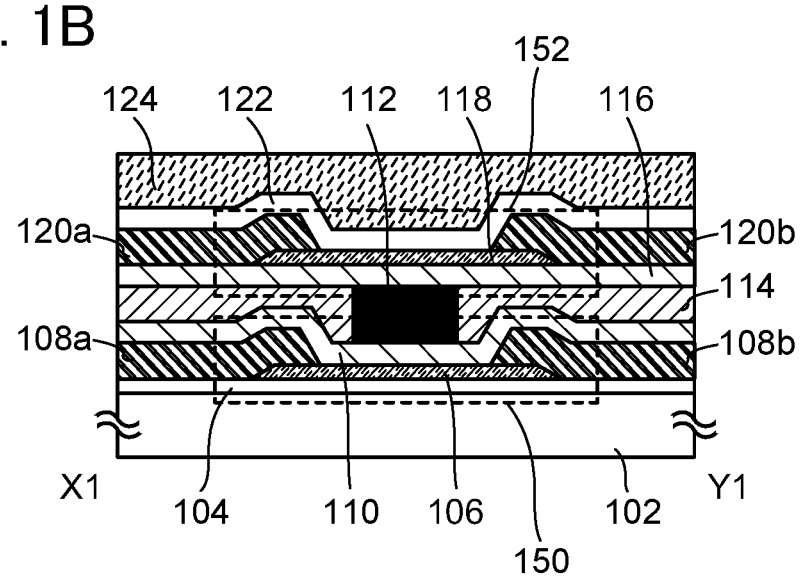

FIGS. 1A and 1B are a top view and a cross-sectional view, respectively, of a transistor as one embodiment of a semiconductor device. Note that FIG. 1A is a top view, and FIG. 1B is a cross-sectional view taken along line X1-Y1 in FIG. 1A. Note that in FIG. 1A, some components of the transistor (e.g., a first gate insulating film 110) are not illustrated for simplicity.

The semiconductor device illustrated in FIGS. 1A and 1B includes a first transistor 150 and a second transistor 152. The first transistor 150 includes a base insulating film 104 formed over a substrate 102; a first semiconductor film 106 formed over the base insulating film 104; a first source electrode 108a and a first drain electrode 108b formed over the first semiconductor film 106; the first gate insulating film 110 formed over the first semiconductor film 106; and a gate electrode 112 which is in contact with the first gate insulating film 110 and overlaps with the first semiconductor film 106. The second transistor 152 includes a second gate insulating film 116 formed over the gate electrode 112; a second semiconductor film 118 which is in contact with the second gate insulating film 116 and overlaps with the gate electrode 112; and a second source electrode 120a and a second drain electrode 120b which are formed over the second semiconductor film 118. The first transistor 150 and the second transistor 152 are stacked.

The semiconductor device illustrated in FIGS. 1A and 1B may include an interlayer insulating film 114 between the first transistor 150 and the second transistor 152, and may include an insulating film 122 and a planarization insulating film 124 over the second transistor 152.

Note that at least one of the first semiconductor film 106 and the second semiconductor film 118 is an oxide semiconductor film. With the use of an oxide semiconductor film for the first semiconductor film 106 or the second semiconductor film 118, the semiconductor device can have high field-effect mobility and operate at high speed.

In this embodiment, a structure in which an oxide semiconductor film is used for each of the first semiconductor film 106 and the second semiconductor film 118 will be described. In the case where the first semiconductor film 106 and the second semiconductor film 118 are preferably equivalent in electrical characteristics, it is effective to use an oxide semiconductor film for each of the first semiconductor film 106 and the second semiconductor film 118 in this manner.

The first transistor 150 and the second transistor 152 have the gate electrode 112 in common. That is, the first transistor 150 is a top-gate transistor in which the gate electrode 112 is provided over the first semiconductor film 106 with the first gate insulating film 110 therebetween, and the second transistor 152 is a bottom-gate transistor in which the second semiconductor film 118 is provided over the gate electrode 112 with the second gate insulating film 116 therebetween. By employing a structure in which the first transistor 150 and the second transistor 152 are stacked and have the gate electrode 112 in common, the area of a region where the transistors are disposed can be reduced. Since the first transistor 150 and the second transistor 152 have the gate electrode 112 in common, the number of manufacturing steps, materials, or the like of the transistors can be reduced.

Note that the details of the other components will be described later in description of a method of manufacturing the semiconductor device with reference to FIGS. 2A to 2D and FIGS. 3A to 3D.

<Method 1 of Manufacturing Semiconductor Device>

Hereinafter, one example of a method of manufacturing the semiconductor device illustrated in FIGS. 1A and 1B of this embodiment will be described with reference to FIGS. 2A to 2D and FIGS. 3A to 3D.

First, the substrate 102 is prepared. There is no particular limitation on a substrate that can be used as the substrate 102 as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium or the like; an SOI substrate; or the like can be used.

A flexible substrate may be used as the substrate 102. In the case where a flexible substrate is used, the first transistor 150 including the first semiconductor film 106 and the second transistor 152 including the second semiconductor film 118 may be directly formed over the flexible substrate; alternatively, the first transistor 150 including the first semiconductor film 106 and the second transistor 152 including the second semiconductor film 118 may be formed over a manufacturing substrate and then may be separated from the manufacturing substrate and transferred to a flexible substrate. Note that in order to separate the transistors from the manufacturing substrate and transfer them to the flexible substrate, a separation layer is preferably provided between the manufacturing substrate and the first transistor 150 including the first semiconductor film 106.

Figure 2A:
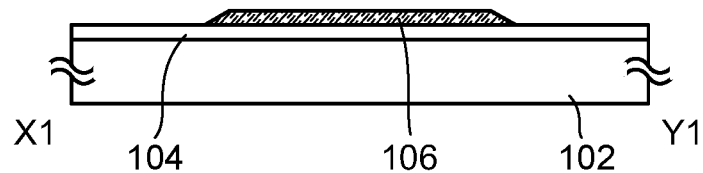
FIGS. 2A to 2D are cross-sectional views illustrating an example of a manufacturing process of a semiconductor device.

Next, the base insulating film 104 is formed over the substrate 102 (see FIG. 2A). The base insulating film 104 has an effect of preventing diffusion of impurity elements such as hydrogen, moisture, and an alkali metal from the substrate 102, and can be formed to have a single-layer structure or a layered structure using one or more films of silicon oxide, silicon nitride, silicon oxynitride, silicon nitride oxide, aluminum oxide, aluminum nitride, aluminum oxynitride, aluminum nitride oxide, hafnium oxide, gallium oxide, and a mixed material of any of these.

Further, the base insulating film 104 has an effect of supplying oxygen to the first semiconductor film 106 to be formed later. For example, in the case where an insulating film containing excess oxygen is used as the base insulating film 104 and an oxide semiconductor film is used as the first semiconductor film 106, part of oxygen can be released by heating the base insulating film 104 to be supplied to the oxide semiconductor film; thus, oxygen vacancies in the oxide semiconductor film can be repaired. In particular, it is preferable that the oxygen content of the base insulating film 104 be in excess of at least that in the stoichiometric composition. For example, a film of silicon oxide represented by the formula $SiO_{2+\alpha}$ ($\alpha>0$) is preferably used as the base insulating film 104. When such a silicon oxide film is used as the base insulating film 104, oxygen can be supplied to the oxide semiconductor film, so that the first transistor 150 including the oxide semiconductor film can have favorable transistor characteristics.

Note that the base insulating film 104 is not necessarily provided. For example, the first semiconductor film 106 may be directly formed over the substrate 102 when a substrate from which impurities such as water, moisture, and an alkali metal are not diffused is used as the substrate 102. However, as described in this embodiment, the base insulating film 104 is preferably provided.

Before the base insulating film 104 is formed, plasma treatment or the like may be performed on the substrate 102. As the plasma treatment, reverse sputtering in which an argon gas is introduced and plasma is generated can be performed. The reverse sputtering is a method in which voltage is applied to the substrate 102 side with the use of an RF power source in an argon atmosphere and plasma is generated in the vicinity of the substrate 102 so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the substrate 102.

Next, an oxide semiconductor film is formed over the base insulating film 104 and a photolithography step and an etching step are performed. Thus, the first semiconductor film 106 is formed (see FIG. 2A).

Note that the base insulating film 104 and the first semiconductor film 106 are preferably formed successively without exposure to the air. By such successive formation without exposure to the air, impurities can be prevented from attaching to or entering the interface between the base insulating film 104 and the first semiconductor film 106.

An oxide semiconductor film can be used as the first semiconductor film 106. The oxide semiconductor film is in a single crystal state, a polycrystalline (also referred to as polycrystal) state, a microcrystalline state, an amorphous state, or the like.

An oxide semiconductor used for the first semiconductor film 106 preferably contains at least indium (In) or zinc (Zn). In particular, In and Zn are preferably contained. As a stabilizer for reducing variation in electrical characteristics of a transistor using the oxide semiconductor, gallium (Ga) is preferably additionally contained. Tin (Sn) is preferably contained as a stabilizer. In addition, as a stabilizer, one or more selected from hafnium (Hf), zirconium (Zr), titanium (Ti), scandium (Sc), yttrium (Y), and an lanthanoid element (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Here, an In—Ga—Zn-based oxide refers to an oxide mainly containing In, Ga, and Zn and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0, m is not an integer) may be used as an oxide semiconductor. Note that M represents one or more metal elements selected from Ga, Fe, Mn, and Co, or the above-described element as a stabilizer. Alternatively, as the oxide semiconductor, a material represented by $In_2SnO_5(ZnO)_n$ (n>0, n is an integer) may be used.

For example, an In—Ga—Zn-based oxide with an atomic ratio of In:Ga:Zn=1:1:1, In:Ga:Zn=3:1:2, or In:Ga:Zn=2:1:3, or any of oxides whose composition is in the neighborhood of the above compositions can be used.

It is preferable that hydrogen or water be contained in the oxide semiconductor film as little as possible in the formation step of the oxide semiconductor film. For example, as pretreatment of the formation step of the oxide semiconductor film, it is preferable that the substrate 102 provided with the base insulating film 104 be preheated in a preheating chamber of a sputtering apparatus to remove and evacuate impurities such as hydrogen and moisture adsorbed to the substrate 102 and the base insulating film 104. Further, the oxide semiconductor film is preferably formed in a deposition chamber from which moisture has been evacuated.

In order to remove the moisture in the preheating chamber and the deposition chamber, an entrapment vacuum pump, for example, a cryopump, an ion pump, or a titanium sublimation pump is preferably used. Further, an evacuation unit may be a turbo pump provided with a cold trap. From the preheating chamber and the deposition chamber which are evacuated with a cryopump, a hydrogen atom, a compound containing a hydrogen atom such as water ($H_2O$) (more preferably, also a compound containing a carbon atom), and the like are removed, whereby the concentration of impurities such as hydrogen and moisture in the first semiconductor film 106 can be reduced.

Note that in this embodiment, an In—Ga—Zn-based oxide is deposited as the first semiconductor film 106 by a sputtering method. The first semiconductor film 106 can be formed by sputtering in a rare gas (typically argon) atmosphere, an oxygen atmosphere, or a mixed atmosphere of a rare gas and oxygen.

As a target used in a sputtering method for forming an In—Ga—Zn-based oxide as the first semiconductor film 106, for example, a metal oxide target having an atomic ratio of In:Ga:Zn=1:1:1, a metal oxide target having an atomic ratio of In:Ga:Zn=3:1:2, or a metal oxide target having an atomic ratio of In:Ga:Zn=2:1:3 can be used, for example. However, a material and composition of a target used for formation of the first semiconductor film 106 is not limited to the above.

Further, when the first semiconductor film 106 is formed using the above-described metal oxide target, the composition of the target is different from that of the thin film formed over the substrate in some cases. For example, when the metal oxide target having a composition of $In_2O_3:Ga_2O_3$:ZnO=1:1:1 [molar ratio] is used, the composition of the oxide semiconductor film used as the first semiconductor film 106, which is the thin film, becomes $In_2O_3:Ga_2O_3$:ZnO=1:1:0.6 to 1:1:0.8 [molar ratio] in some cases, though it depends on the film formation conditions. This is because in formation of the oxide semiconductor film used as the first semiconductor film 106, ZnO is sublimed, or because a sputtering rate differs between the components of $In_2O_3$, $Ga_2O_3$, and ZnO.

Accordingly, in order that a thin film has desired composition, the composition of a metal oxide target needs to be adjusted in advance. For example, in order to make the composition of the first semiconductor film 106, which is the thin film, be $In_2O_3:Ga_2O_3:ZnO=1:1:1$ [molar ratio], the composition of the metal oxide target is made to be $In_2O_3:Ga_2O_3:ZnO=1:1:1.5$ [molar ratio]. In other words, the ZnO content of the metal oxide target is made higher in advance. The composition of the target is not limited to the above value, and can be adjusted as appropriate depending on the film formation conditions or the composition of the thin film to be formed. Further, it is preferable to increase the ZnO content of the metal oxide target because in that case, the crystallinity of the obtained thin film is improved.

The relative density of the metal oxide target is higher than or equal to 90% and lower than or equal to 100%, preferably higher than or equal to 95% and lower than or equal to 99.9%. With the use of a metal oxide target with high relative density, the formed first semiconductor film 106 can have high density.

It is preferable that a high-purity gas from which impurities such as hydrogen, water, a hydroxyl group, and a hydride are removed be used as a sputtering gas used for the formation of the first semiconductor film 106.

Further, the oxide semiconductor film used as the first semiconductor film 106 is preferably a c-axis aligned crystalline oxide semiconductor (CAAC-OS) film. Here, the CAAC-OS film that can be used as the first semiconductor film 106 will be described in detail below.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, a change in the electrical characteristics of the transistor due to irradiation with visible light or ultraviolet light can be reduced. Further, a shift and a variation of the threshold voltage can be suppressed. Thus, the transistor has high reliability.

In a crystal part or a crystalline oxide semiconductor, defects in the bulk can be further reduced. Further, when the surface planarity of the crystal part or the crystalline oxide semiconductor film is enhanced, a transistor including the oxide semiconductor can have higher field-effect mobility than a transistor including an amorphous oxide semiconductor. In order to enhance the surface planarity of the oxide semiconductor film, the oxide semiconductor is preferably formed over a flat surface. Specifically, the oxide semiconductor is preferably formed over a surface with an average surface roughness ($R_a$) less than or equal to 0.15 nm, preferably less than or equal to 0.1 nm.

Note that $R_a$ is obtained by expanding arithmetic mean surface roughness, which is defined by JIS B 0601: 2001 (ISO4287: 1997), into three dimensions so as to be applied to a curved surface. In addition, $R_a$ can be expressed as "an average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy \qquad \text{[Formula 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_1, y_1))$, and $(x_2, y_2, f(x_2, y_2))$. Moreover, $S_0$ represents the area of a rectangle which is obtained by projecting the specific surface on the xy plane, and $Z_0$ represents the height of the reference surface (the average height of the specific surface). Further, $R_a$ can be measured using an atomic force microscope (AFM).

There are three methods for forming a CAAC-OS film when the CAAC-OS film is used as the first semiconductor film 106. The first method is to form an oxide semiconductor film at a temperature higher than or equal to 200° C. and lower than or equal to 450° C. to form, in the oxide semiconductor film, crystal parts in which the c-axes are aligned in the direction parallel to a normal vector of a surface where the oxide semiconductor film is formed or a normal vector of a surface of the oxide semiconductor film.

The second method is to form an oxide semiconductor film with a small thickness and then heat it at a temperature higher than or equal to 200° C. and lower than or equal to 700° C., to form, in the oxide semiconductor film, crystal parts in which the c-axes are aligned in the direction parallel to a normal vector of a surface where the oxide semiconductor film is formed or a normal vector of a surface of the oxide semiconductor film. The third method is to form one oxide semiconductor film with a small thickness, then heat it at a temperature higher than or equal to 200° C. and lower than or equal to 700° C., and form another oxide semiconductor film, to form, in the oxide semiconductor film, crystal parts in which the c-axes are aligned in the direction parallel to a normal vector of a surface where the oxide semiconductor film is formed or a normal vector of a surface of the oxide semiconductor film.

By heating the substrate 102 during deposition, the concentration of an impurity such as hydrogen or water in the formed first semiconductor film 106 can be reduced. In addition, damage by sputtering can be reduced, which is preferable. The first semiconductor film 106 may be formed by an atomic layer deposition (ALD) method, an evaporation method, a coating method, or the like.

Note that when a crystalline (single crystal or microcrystalline) oxide semiconductor film other than a CAAC-OS film is formed as the first semiconductor film 106, there is no particular limitation on the deposition temperature.

In this embodiment, as a method of forming the first semiconductor film 106, the oxide semiconductor film is etched by a dry etching method. As an etching gas, $BCl_3$, $Cl_2$, $O_2$, or the like can be used. A dry etching apparatus using a high-density plasma source such as ECR or ICP can be used to improve an etching rate.

After the first semiconductor film 106 is formed, heat treatment may be performed on the first semiconductor film 106. The temperature of the heat treatment is higher than or equal to 300° C. and lower than or equal to 700° C., or lower than the strain point of the substrate. Through the heat treatment, excess hydrogen (including water and a hydroxyl group) can be removed from the oxide semiconductor film used as the first semiconductor film 106. Note that the heat treatment is also referred to as dehydration treatment (dehydrogenation treatment) in this specification and the like in some cases.

The heat treatment can be performed in such a manner that, for example, an object to be processed is introduced into an electric furnace in which a resistance heater or the like is used and heated at 450° C. in a nitrogen atmosphere for an hour. During the heat treatment, the first semiconductor film 106 is not exposed to the air to prevent entry of water and hydrogen.

The heat treatment apparatus is not limited to the electric furnace and may be an apparatus for heating an object to be processed by thermal conduction or thermal radiation from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the heat treatment, the GRTA process may be performed as follows. The object is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object. Note that the inert gas may be changed to a gas including oxygen during the process.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is 6 N (99.9999%) or higher, preferably 7 N (99.99999%) or higher (that is, the impurity concentration is 1 ppm or lower, preferably 0.1 ppm or lower).

Through the dehydration treatment (dehydrogenation treatment), oxygen that is a main component material of an oxide semiconductor film might be eliminated and thus might be reduced. An oxygen vacancy exists in a portion where oxygen is eliminated in an oxide semiconductor film, and a donor level which leads to a change in the electrical characteristics of a transistor is formed owing to the oxygen vacancy. Therefore, in the case where the dehydration treatment (dehydrogenation treatment) is performed, oxygen is preferably supplied to the oxide semiconductor film. By supply of oxygen to the oxide semiconductor film, an oxygen vacancy in the film can be repaired.

The oxygen vacancy in the oxide semiconductor film may be repaired in the following manner for example: after the oxide semiconductor film is subjected to the dehydration treatment (dehydrogenation treatment), a high-purity oxygen gas, a high-purity nitrous oxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) is introduced into the same furnace. It is preferable that water, hydrogen, and the like be not contained in the oxygen gas or the nitrous oxide gas. The purity of the oxygen gas or the nitrous oxide gas which is introduced into the heat treatment apparatus is preferably 6N (99.9999%) or higher, more preferably 7N (99.99999%) or higher (i.e., the impurity concentration in the oxygen gas or the nitrous oxide gas is preferably 1 ppm or lower, more preferably 0.1 ppm or lower).

As an example of a method of supplying oxygen to the oxide semiconductor film, oxygen (including at least any one of oxygen radicals, oxygen atoms, and oxygen ions) is added to the oxide semiconductor film in order to supply oxygen to the oxide semiconductor film. An ion implantation method, an ion doping method, a plasma immersion ion implantation method, plasma treatment, or the like can be used as a method of adding oxygen.

As another example of a method of supplying oxygen to the oxide semiconductor film used as the first semiconductor film 106, the base insulating film 104, the first gate insulating film 110 to be formed later, or the like is heated and part of oxygen is released.

As described above, after the oxide semiconductor film is formed, it is preferable that the dehydration treatment (dehydrogenation treatment) be performed to remove hydrogen or moisture from the oxide semiconductor film, so that the oxide semiconductor film is highly purified so as not to contain an impurity as much as possible, and oxygen whose amount is reduced in the dehydration treatment (dehydrogenation treatment) be added to the oxide semiconductor film or excess oxygen be supplied to repair oxygen vacancies in the oxide semiconductor film. In this specification and the like, supplying oxygen to an oxide semiconductor film may be expressed as oxygen adding treatment or treatment for making the oxygen content of an oxide semiconductor film be in excess of that in the stoichiometric composition may be expressed as treatment for making an oxygen-excess state.

Note that in the above-described method, the dehydration treatment (dehydrogenation treatment) and the oxygen adding treatment are performed after the oxide semiconductor film is processed into an island shape; however, one embodiment of the disclosed invention is not construed as being limited thereto. Such treatment may be performed before the oxide semiconductor film is processed to have an island shape. Alternatively, after the interlayer insulating film 114 is formed, heat treatment may be performed so that oxygen is supplied from the base insulating film 104, the first gate insulating film 110, or the like to the oxide semiconductor film.

In this manner, hydrogen or moisture is removed from the oxide semiconductor film that can be used as the first semiconductor film 106 by the dehydration treatment (dehydrogenation treatment) and oxygen vacancies therein are repaired by the oxygen adding treatment, whereby the oxide semiconductor film can be turned into an electrically i-type (intrinsic) or substantially i-type oxide semiconductor film. The oxide semiconductor film formed in such a manner contains extremely few (close to zero) carriers derived from a donor, and the carrier concentration therein is lower than $1 \times 10^{14}/cm^3$, preferably lower than $1 \times 10^{12}/cm^3$, more preferably lower than $1 \times 10^{11}/cm^3$.

In the case where the oxide semiconductor film is used as the first semiconductor film 106, the oxide semiconductor film is preferably highly purified so as to hardly contain impurities such as copper, aluminum, and chlorine. It is preferable that steps through which these impurities do not enter the oxide semiconductor film or are not attached to the surface of the oxide semiconductor film be selected as appropriate as the manufacturing steps of the transistor. When these impurities are attached to the surface of the oxide semiconductor film, it is preferable to remove the impurities on the surface of the oxide semiconductor film by exposure to oxalic acid, diluted hydrofluoric acid, or the like or by plasma treatment (e.g., $N_2O$ plasma treatment). Specifically, the copper concentration in the oxide semiconductor film is $1 \times 10^{18}$ atoms/cm$^3$ or lower, preferably $1 \times 10^{17}$ atoms/cm$^3$ or lower. Further, the aluminum concentration in the oxide semiconductor film is $1 \times 10^{18}$ atoms/cm$^3$ or lower. Further, the chlorine concentration in the oxide semiconductor film is $2 \times 10^{18}$ atoms/cm$^3$ or lower.

The oxide semiconductor film is preferably in a supersaturated state in which the oxygen content is in excess of that in the stoichiometric composition just after its formation. For example, in the case where the oxide semiconductor film is formed by a sputtering method, the film is preferably formed under a condition that the proportion of oxygen in a deposition gas is large, in particular, under an oxygen atmosphere (oxygen gas: 100%). For example, when the oxide semiconductor film is formed using an In—Ga—Zn-based oxide (IGZO) under a condition that the proportion of oxygen in the deposition gas is large (in particular, oxygen gas: 100%), release of Zn from the film can be reduced even when the deposition temperature is 300° C. or higher.

The oxide semiconductor film is preferably an oxide semiconductor film which is highly purified by sufficient removal of impurities such as hydrogen or by sufficient supply of oxygen so as to be supersaturated with oxygen. Specifically, the hydrogen concentration in the oxide semiconductor film is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the above hydrogen concentration in the oxide semiconductor film is measured by secondary ion mass spectrometry (SIMS). In order that the oxide semiconductor film is supersaturated with oxygen by sufficient supply of oxygen, an insulating film containing excess oxygen (such as a $SiO_x$ film) is preferably provided so as to surround and be in contact with the oxide semiconductor film.

As the insulating film containing excess oxygen, a $SiO_x$ film or a silicon oxynitride film including a large amount of oxygen by adjusting deposition conditions as appropriate in a PE-CVD method or a sputtering method is used. In the case where the insulating film is formed so as to further contain excess oxygen, oxygen is added to the insulating film by an ion implantation method, an ion doping method, or plasma treatment.

In the case where the hydrogen concentration in the insulating film containing excess oxygen is higher than or equal to $7.2 \times 10^{20}$ atoms/cm$^3$, variation in initial characteristics of transistors is increased, an L length dependence of electrical characteristics of a transistor is increased, and a transistor significantly deteriorates in the BT stress test; therefore, the hydrogen concentration in the insulating film containing excess oxygen should be lower than $7.2 \times 10^{20}$ atoms/cm$^3$. In other words, the hydrogen concentration in the oxide semiconductor film is preferably lower than or equal to $5 \times 10^{19}$ atoms/cm$^3$, and the hydrogen concentration in the insulating film containing excess oxygen is preferably lower than $7.2 \times 10^{20}$ atoms/cm$^3$.

In addition, a blocking film (such as an $AlO_x$ film) for preventing oxygen from being released from the oxide semiconductor film is preferably provided so as to surround the oxide semiconductor film and be positioned outside the insulating film containing excess oxygen.

When the oxide semiconductor film is surrounded by the insulating film containing excess oxygen or the blocking film, the oxygen content of the oxide semiconductor film can be substantially the same as that in the stoichiometric composition, or can be in excess of that in the stoichiometric composition i.e., the oxide semiconductor film can be supersaturated with oxygen. For example, in the case where the oxide semiconductor film is formed of IGZO, an example of stoichiometric composition is In:Ga:Zn:O=1:1:1:4 [atomic ratio]; thus the ratio of oxygen atoms is 4 or larger.

Figure 2B:
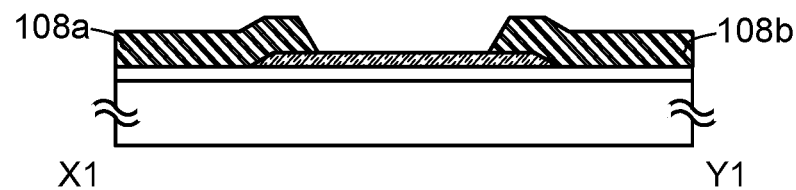

Next, a conductive film is formed over the first semiconductor film 106, and a photolithography step and an etching step are performed; thus, the first source electrode 108a and the first drain electrode 108b are formed (see FIG. 2B).

The conductive film that can be used for the first source electrode 108a and the first drain electrode 108b is formed using a material that can withstand heat treatment performed later. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. It is also possible to use a structure in which a film of a high-melting-point metal such as Ti, Mo, or W or a metal nitride film thereof (e.g., a titanium nitride film, a molybdenum nitride film, or a tungsten nitride film) is stacked over and/or below a metal film of Al, Cu, or the like.

Alternatively, the conductive film used for the first source electrode 108a and the first drain electrode 108b may be formed using a conductive metal oxide. Examples of the conductive metal oxide are indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials in which silicon oxide is contained.

Figure 2C:
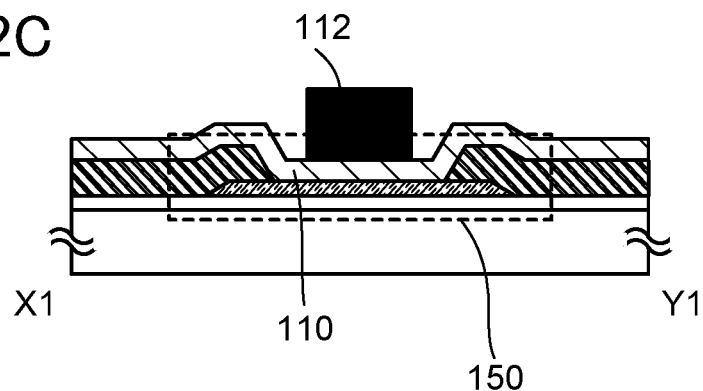

Next, the first gate insulating film 110 is formed over the first semiconductor film 106, the first source electrode 108a, and the first drain electrode 108b (see FIG. 2C).

The thickness of the first gate insulating film 110 can be greater than or equal to 1 nm and less than or equal to 500 nm, for example. There is no particular limitation on a method of forming the first gate insulating film 110; for example, a sputtering method, an MBE method, a PE-CVD method, a pulsed laser deposition method, an ALD method, or the like can be used as appropriate.

The first gate insulating film 110 can be formed using silicon oxide, gallium oxide, aluminum oxide, silicon nitride, silicon oxynitride, aluminum oxynitride, silicon nitride oxide, or the like. In the case where the first semiconductor film 106 is the oxide semiconductor film, the first gate insulating film 110 is preferably an insulating film in which a portion in contact with the first semiconductor film 106 contains excess oxygen. In particular, the oxygen content of the first gate insulating film 110 is preferably in excess of at least that in the stoichiometric composition. For example, in the case where a silicon oxide film is used as the first gate insulating film 110, a film of $SiO_{2+\alpha}$ ($\alpha>0$) is preferably used. In this embodiment, a silicon oxide film of $SiO_{2+\alpha}$ ($\alpha>0$) is used as the first gate insulating film 110. With the use of the silicon oxide film as the first gate insulating film 110, oxygen can be supplied to the oxide semiconductor film used as the first semiconductor film 106 from the first gate insulating film 110 as well as from the base insulating film 104 and favorable electrical characteristics can be obtained.

The first gate insulating film 110 can be formed using a high-k material such as hafnium oxide, yttrium oxide, hafnium silicate ($HfSi_xO_y$ ($x>0$, $y>0$)), hafnium silicate to which nitrogen is added ($HfSi_xO_yN_z$ ($x>0$, $y>0$, $z>0$)), hafnium aluminate ($HfAl_xO_y$ ($x>0$, $y>0$)), or lanthanum oxide. With the use of such a material, gate leakage current can be reduced. Further, the first gate insulating film 110 may have a single-layer structure or a layered structure.

Next, a conductive film to be the gate electrode (including a wiring formed using the same layer as the gate electrode) is formed over the first gate insulating film 110. The conductive film to be the gate electrode can be formed using a metal material such as molybdenum, titanium, tantalum, tungsten, aluminum, copper, neodymium, or scandium, or an alloy material including any of these materials as its main component, for example. Alternatively, the conductive film to be the gate electrode may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), or any of these metal oxide materials in which silicon or silicon oxide is included can be used. The conductive film to be the gate electrode can be formed to have a single-layer structure or a layered structure using any of the above materials. There is no particular limitation on the method for forming the conductive film, and a variety of film formation methods such as an evaporation method, a PE-CVD method, a sputtering method, and a spin coating method can be employed.

Next, a resist mask is formed over the conductive film through a photolithography step and selective etching is performed, so that the gate electrode 112 is formed. Then, the resist mask is removed. At this stage, the first transistor 150 is formed (see FIG. 2C).

The resist mask used for forming the gate electrode 112 may be formed by an inkjet method. Formation of the resist mask by an inkjet method needs no photomask; thus, manufacturing cost can be reduced. For etching the gate electrode 112, wet etching or dry etching, or both of them may be employed.

Figure 2D:
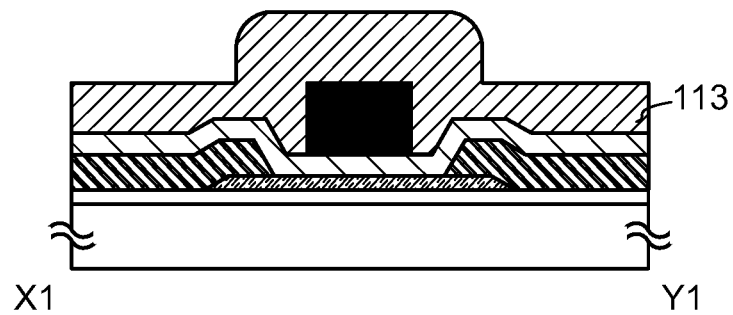

Then, an insulating film 113 is formed over the first gate insulating film 110 and the gate electrode 112 (see FIG. 2D).

The insulating film 113 is preferably formed using an inorganic insulating film and may be formed as a single layer or a stacked layer of any of oxide insulating films such as a silicon oxide film, a silicon oxynitride film, an aluminum oxide film, an aluminum oxynitride film, a gallium oxide film, and a hafnium oxide film. Further, over the above oxide insulating film, a single layer or a stacked layer of any of nitride insulating films such as a silicon nitride film, a silicon nitride oxide film, an aluminum nitride film, and an aluminum nitride oxide film may be formed. For example, by a sputtering method, a silicon oxide film and an aluminum oxide film are stacked from the gate electrode 112 side.

Further, a dense inorganic insulating film may be provided as the insulating film 113. For example, an aluminum oxide film is formed by a sputtering method. When the aluminum oxide film has high density (the film density is higher than or equal to 3.2 g/cm$^3$, preferably higher than or equal to 3.6 g/cm$^3$), the first transistor 150 can have stable electrical characteristics. The film density can be measured by Rutherford backscattering spectrometry (RBS) or X-ray reflection (XRR).

The aluminum oxide film that can be used as the inorganic insulating film provided over the first transistor 150 has a high shielding effect (blocking effect) of preventing penetration of both oxygen and impurities such as hydrogen and moisture. Therefore, in the case where the first semiconductor film 106 is the oxide semiconductor film, in and after the manufacturing process, the aluminum oxide film functions as a protective film for preventing entry of impurities such as hydrogen and moisture, which cause a change, into the oxide semiconductor film, and for preventing release of oxygen, which is a main component material of the oxide semiconductor film.

A planarization insulating film may be formed over the insulating film 113. For the planarization insulating film, a heat-resistant organic material such as an acrylic-based resin, a polyimide-based resin, a benzocyclobutene-based resin, a polyamide-based resin, or an epoxy-based resin can be used. As an alternative to such organic materials, it is possible to use a low-dielectric constant material (low-k material), a siloxane-based resin, or the like. Note that the planarizing insulating film may be formed by stacking a plurality of insulating films formed of any of these materials.

Next, polishing (cutting or grinding) treatment is performed on the insulating film 113 to remove part of the insulating film 113, so that the gate electrode 112 is exposed. By the polishing treatment, the insulating film 113 over the gate electrode 112 is removed, and the interlayer insulating film 114 is formed (see FIG. 3A).

As the polishing (cutting or grinding) treatment, chemical mechanical polishing (CMP) treatment can be preferably used.

Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the planarity of the polished surface can be further improved.

Polishing (cutting or grinding) treatment other than the above CMP treatment may be used. Alternatively, the polishing treatment such as the CMP treatment may be combined with etching (dry etching or wet etching) treatment, plasma treatment, or the like. For example, after the CMP treatment, dry etching treatment or plasma treatment (e.g., reverse sputtering) may be performed in order to improve the planarity of the surface to be processed. In the case where the polishing treatment is combined with etching treatment, plasma treatment, or the like, the order of the steps may be set as appropriate, without particular limitation, depending on the material, thickness, and roughness of the surface of the insulating film 113.

In this embodiment, a top end of the gate electrode 112 and a top end of the interlayer insulating film 114 are substantially in alignment with each other. Note that the shape of the gate electrode 112 depends on the conditions of the polishing treatment performed on the insulating film 113. For example, in some cases, the gate electrode 112 in the film thickness direction is not level with the interlayer insulating film 114 in the film thickness direction.

Figure 3A:
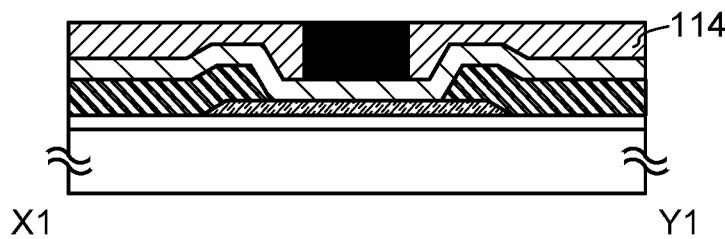
FIGS. 3A to 3D are cross-sectional views illustrating an example of a manufacturing process of a semiconductor device.
Figure 3B:
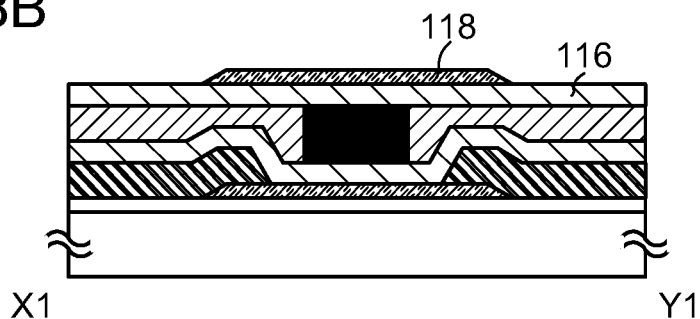
Figure 3C:
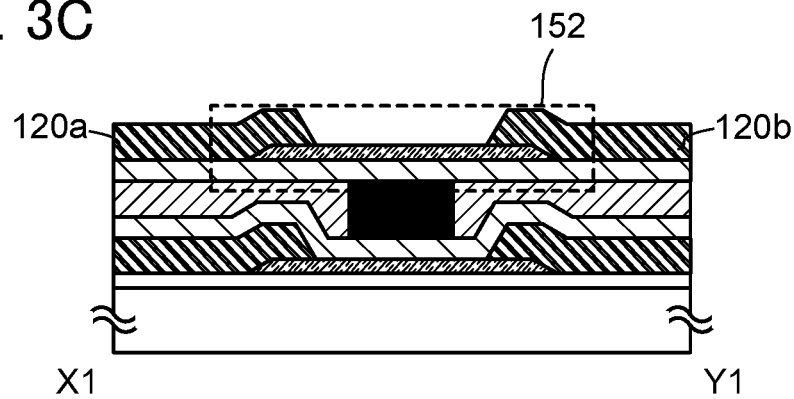

Next, the second gate insulating film 116 is formed over the interlayer insulating film 114 and the gate electrode 112 (see FIG. 3B).

The second gate insulating film 116 can be formed using a material and a method similar to those for the first gate insulating film 110.

Then, an oxide semiconductor film is formed over the second gate insulating film 116, and a photolithography step and an etching step are performed; thus, the second semiconductor film 118 is formed (see FIG. 3B). The oxide semiconductor film used as the second semiconductor film 118 is preferably a CAAC-OS film.

The second semiconductor film 118 can be formed using a material and a method similar to those for the first semiconductor film 106.

Next, a conductive film is formed over the second semiconductor film 118, and a photolithography step and an etching step are performed; thus, the second source electrode 120a and the second drain electrode 120b are formed. At this stage, the second transistor 152 is formed (see FIG. 3C).

The second source electrode 120a and the second drain electrode 120b can be formed using a material and a method similar to those for the first source electrode 108a and the first drain electrode 108b.

Figure 3D:
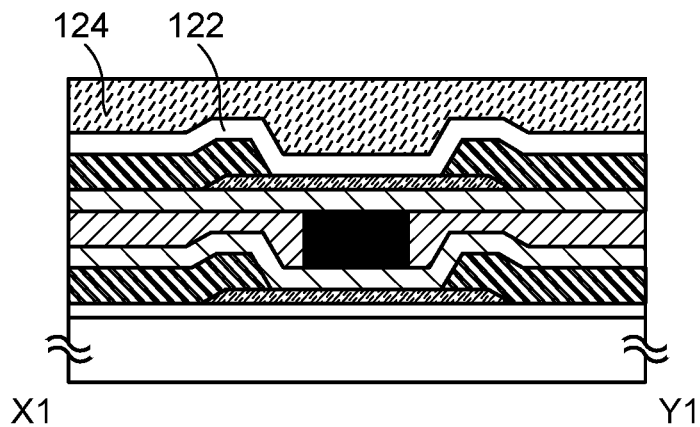

Next, the insulating film 122 and the planarization insulating film 124 are formed over the second transistor 152 (see FIG. 3D).

The insulating film 122 can be formed using a material and a method similar to those for the insulating film 113. For the planarization insulating film 124, a heat-resistant organic material such as an acrylic-based resin, a polyimide-based resin, a benzocyclobutene-based resin, a polyamide-based resin, or an epoxy-based resin can be used. As an alternative to such organic materials, it is possible to use a low-dielectric constant material (low-k material), a siloxane-based resin, or the like. Note that the planarizing insulating film may be formed by stacking a plurality of insulating films formed of any of these materials.

Through the above steps, a semiconductor device of one embodiment of the present invention is formed.

In the semiconductor device described in this embodiment, at least one of the first semiconductor film and the second semiconductor film is an oxide semiconductor film. With the use of an oxide semiconductor film for the first semiconductor film or the second semiconductor film, the semiconductor device can have high field-effect mobility and operate at high speed.

By employing a structure in which the first transistor including the first semiconductor film and the second transistor including the second semiconductor film are stacked and have the gate electrode in common, the area of a region where the transistors are disposed can be reduced. Since the first transistor and the second transistor have the gate electrode in common, the number of manufacturing steps, materials, or the like of the transistors can be reduced.

The structures, methods, and the like described in this embodiment can be combined as appropriate with any of the structures, methods, and the like described in the other embodiments.

Embodiment 2

In this embodiment, a modification example of the semiconductor device illustrated in FIGS. 1A and 1B of Embodiment 1 and a manufacturing method which is different from the manufacturing method of the semiconductor device illustrated in FIGS. 2A to 2D and FIGS. 3A to 3D of Embodiment 1 will be described with reference to FIGS. 4A and 4B, FIGS. 5A to 5D, and FIGS. 6A to 6D. Note that portions similar to those in FIGS. 1A and 1B, FIGS. 2A to 2D, and FIGS. 3A to 3D are denoted by the same reference numerals, and description thereof is skipped.

Structural Example of Semiconductor Device (Modification Example 1)

Figure 4A:
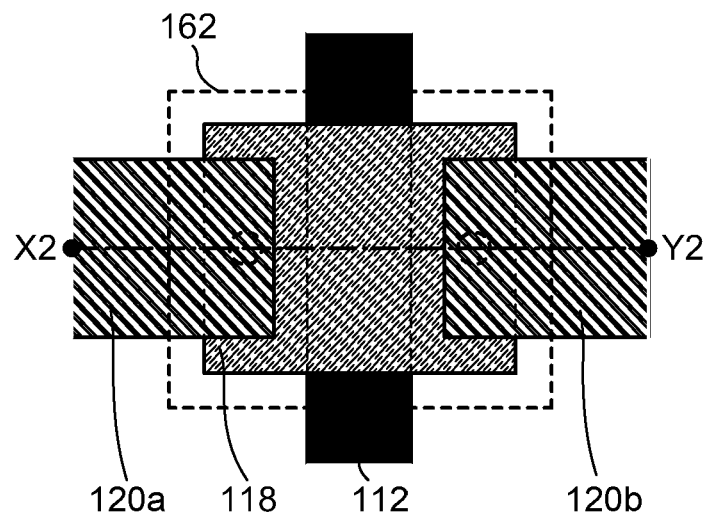
FIGS. 4A and 4B are a top view and a cross-sectional view illustrating one embodiment of a semiconductor device.
Figure 4B:
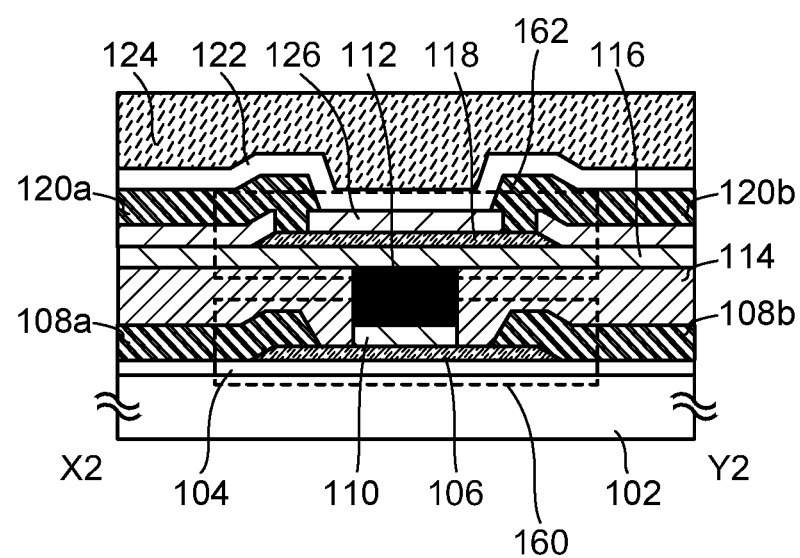

FIGS. 4A and 4B are a top view and a cross-sectional view, respectively, of a transistor as one embodiment of a semiconductor device. Note that FIG. 4A is a top view, and FIG. 4B is a cross-sectional view taken along line X2-Y2 in FIG. 4A. Note that in FIG. 4A, some components of the transistor (e.g., the first gate insulating film 110) are not illustrated for simplicity.

The semiconductor device illustrated in FIGS. 4A and 4B includes a first transistor 160 and a second transistor 162. The first transistor 160 includes the base insulating film 104 formed over the substrate 102; the first semiconductor film 106 formed over the base insulating film 104; the first source electrode 108a and the first drain electrode 108b formed over the first semiconductor film 106; the first gate insulating film 110 formed over the first semiconductor film 106; and the gate electrode 112 which is in contact with the first gate insulating film 110 and overlaps with the first semiconductor film 106. The second transistor 162 includes the second gate insulating film 116 formed over the gate electrode 112; the second semiconductor film 118 which is in contact with the second gate insulating film 116 and overlaps with the gate electrode 112; a protective insulating film 126 formed over the second semiconductor film 118; and the second source electrode 120a and the second drain electrode 120b which are formed over the protective insulating film 126 and are electrically connected to the second semiconductor film 118. The first transistor 160 and the second transistor 162 are stacked.

The semiconductor device illustrated in FIGS. 4A and 4B may include the interlayer insulating film 114 between the first transistor 160 and the second transistor 162, and may include the insulating film 122 and the planarization insulating film 124 over the second transistor 162.

Note that at least one of the first semiconductor film 106 and the second semiconductor film 118 is an oxide semiconductor film. With the use of an oxide semiconductor film for the first semiconductor film 106 or the second semiconductor film 118, the semiconductor device can have high field-effect mobility and operate at high speed.

In this embodiment, a structure in which an oxide semiconductor film is used for each of the first semiconductor film 106 and the second semiconductor film 118 is employed. In the case where the first semiconductor film 106 and the second semiconductor film 118 are preferably equivalent in electrical characteristics, it is effective to use an oxide semiconductor film for each of the first semiconductor film 106 and the second semiconductor film 118 in this manner.

The first transistor 160 and the second transistor 162 have the gate electrode 112 in common. That is, the first transistor 160 is a top-gate transistor in which the gate electrode 112 is provided over the first semiconductor film 106 with the first gate insulating film 110 therebetween, and the second transistor 162 is a bottom-gate transistor in which the second semiconductor film 118 is provided over the gate electrode 112 with the second gate insulating film 116 therebetween. By employing a structure in which the first transistor 160 and the second transistor 162 are stacked and have the gate electrode 112 in common, the area of a region where the transistors are disposed can be reduced. Since the first transistor 160 and the second transistor 162 have the gate electrode 112 in common, the number of manufacturing steps, materials, or the like of the transistors can be reduced.

The semiconductor device including the first transistor 160 and the second transistor 162 in this embodiment is different from the semiconductor device including the first transistor 150 and the second transistor 152 in Embodiment 1 in the structures of the transistors.

Specifically, the first transistor 160 in this embodiment is different from the first transistor 150 in the structure of the first gate insulating film 110; in this embodiment, the first gate insulating film 110 is processed into an island shape and is formed only under the gate electrode 112.

Unlike the second transistor 152, the second transistor 162 in this embodiment includes the protective insulating film 126 over the second semiconductor film 118. Since the protective insulating film 126 is provided, the second semiconductor film 118 can be protected when the second source electrode 120a and the second drain electrode 120b are processed. Note that although the protective insulating film 126 protects a top surface and a side surface of the second semiconductor film 118 in this embodiment, one embodiment of the present invention is not limited thereto. For example, the protective insulating film 126 having an island shape may be formed only over a channel formation portion of the second semiconductor film 118.

Note that the details of the other components will be described later in description of a method of manufacturing the semiconductor device with reference to FIGS. 5A to 5D and FIGS. 6A to 6D.

<Method 2 of Manufacturing Semiconductor Device>

Hereinafter, one example of a method of manufacturing the semiconductor device illustrated in FIGS. 4A and 4B of this embodiment will be described with reference to FIGS. 5A to 5D and FIGS. 6A to 6D.

Figure 5A:
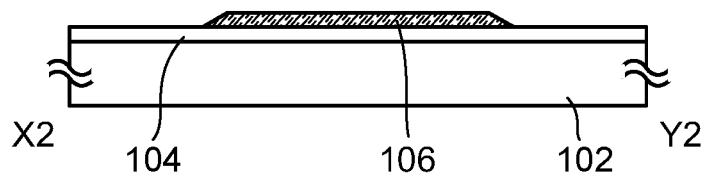
FIGS. 5A to 5D are cross-sectional views illustrating an example of a manufacturing process of a semiconductor device.

First, the base insulating film 104 and the first semiconductor film 106 are formed over the substrate 102 (see FIG. 5A).

Note that the substrate 102, the base insulating film 104, and the first semiconductor film 106 can have structures similar to those in Embodiment 1.

Figure 5B:
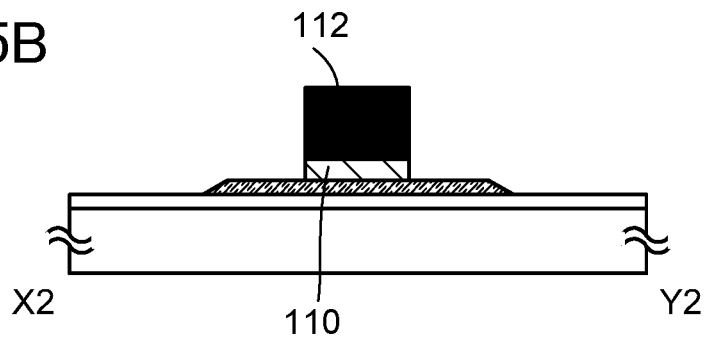
Figure 5C:
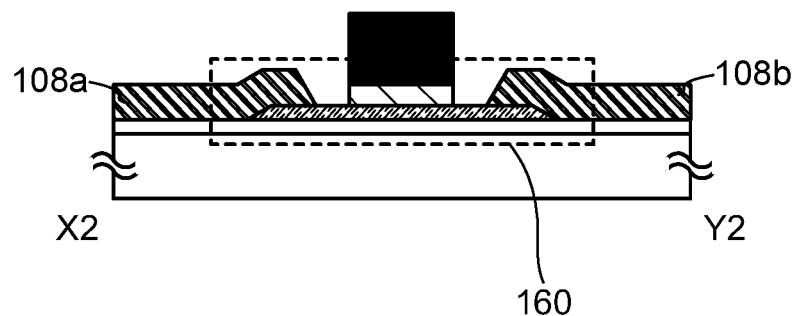

Next, an insulating film and a conductive film are formed over the first semiconductor film 106, and a photolithography step and an etching step are performed; thus, the first gate insulating film 110 and the gate electrode 112 are formed (see FIG. 5B).

The first gate insulating film 110 can be formed in such a manner that, after the gate electrode 112 is formed, etching is performed with the gate electrode 112 used as a mask.

Note that the first gate insulating film 110 and the gate electrode 112 can have structures similar to those in Embodiment 1.

Next, a conductive film is formed over the first semiconductor film 106, and a photolithography step and an etching step are performed; thus, the first source electrode 108a and the first drain electrode 108b are formed. At this stage, the first transistor 160 is formed (see FIG. 5C).

The first source electrode 108a and the first drain electrode 108b can have a structure similar to that in Embodiment 1.

Figure 5D:
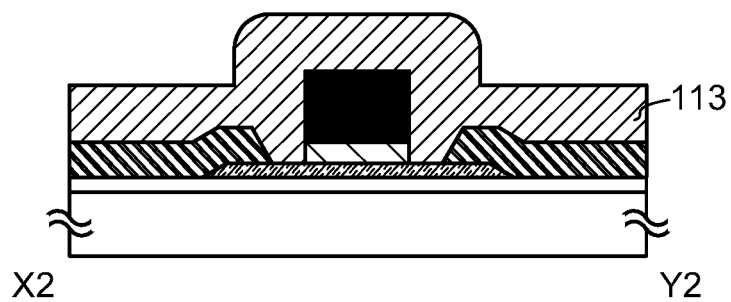

Next, the insulating film 113 is formed over the first transistor 160 (see FIG. 5D).

The insulating film 113 can have a structure similar to that in Embodiment 1.

Next, polishing (cutting or grinding) treatment is performed on the insulating film 113 to remove part of the insulating film 113, so that the gate electrode 112 is exposed. By the polishing treatment, the insulating film 113 over the gate electrode 112 is removed, and the interlayer insulating film 114 is formed (see FIG. 6A).

As the polishing (cutting or grinding) method, a method similar to that in Embodiment 1 can be employed. In this embodiment, a top end of the gate electrode 112 and a top end of the interlayer insulating film 114 are substantially in alignment with each other. Note that the shape of the gate electrode 112 depends on the conditions of the polishing treatment performed on the insulating film 113. For example, in some cases, the gate electrode 112 in the film thickness direction is not level with the interlayer insulating film 114 in the film thickness direction.

Figure 6A:
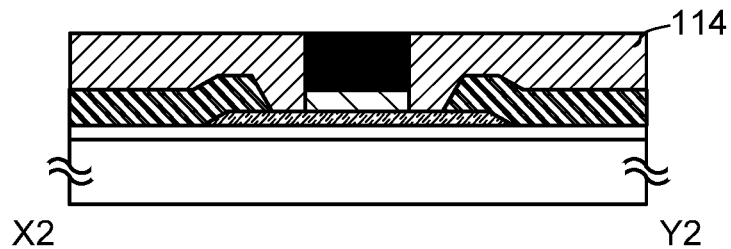
FIGS. 6A to 6D are cross-sectional views illustrating an example of a manufacturing process of a semiconductor device.
Figure 6B:
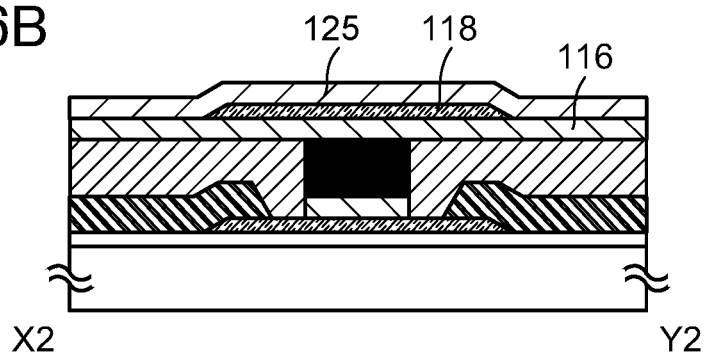
Figure 6C:
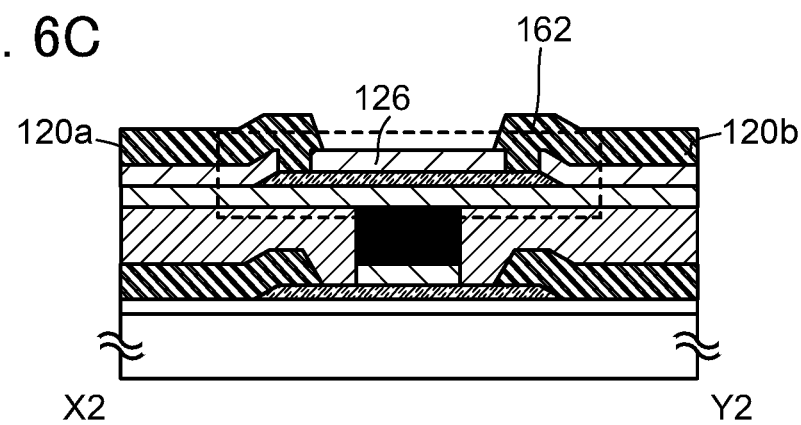

Next, the second gate insulating film 116, the second semiconductor film 118, and an insulating film 125 are formed over the interlayer insulating film 114 and the gate electrode 112 (see FIG. 6B).

The second gate insulating film 116 and the second semiconductor film 118 can have structures similar to those in Embodiment 1. The insulating film 125 can be formed using silicon oxide, gallium oxide, aluminum oxide, silicon nitride, silicon oxynitride, aluminum oxynitride, silicon nitride oxide, or the like. In the case where the second semiconductor film 118 is an oxide semiconductor film, a portion of the insulating film 125 in contact with the second semiconductor film 118 preferably contains oxygen. In particular, it is preferable that the oxygen content of the insulating film 125 be in excess of that in the stoichiometric composition. For example, in the case where a silicon oxide film is used as the insulating film 125, the composition formula is preferably $SiO_{2+\alpha}$ ($\alpha > 0$). In this embodiment, a silicon oxide film of SiO$_{2+\alpha}$ ($\alpha$>0) is used as the insulating film 125. With the use of the silicon oxide film as the insulating film 125, oxygen can be supplied to the oxide semiconductor film used as the second semiconductor film 118 and favorable electrical characteristics can be obtained.

Then, a resist mask is formed over the insulating film 125 by a photolithography step and etching is selectively performed; thus, openings reaching the second semiconductor film 118 are formed and the protective insulating film 126 is formed from the insulating film 125. After that, the resist mask is removed, so that the second source electrode 120*a* and the second drain electrode 120*b* are formed so as to fill the openings. At this stage, the second transistor 162 is formed (see FIG. 6C).

Figure 6D:
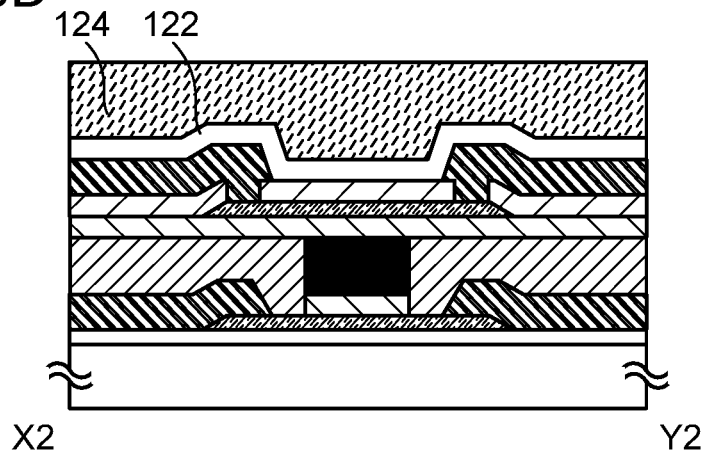

Next, the insulating film 122 and the planarization insulating film 124 are formed over the second transistor 162 (see FIG. 6D).

Note that the second source electrode 120*a* and the second drain electrode 120*b*, the insulating film 122, and the planarization insulating film 124 can have structures similar to those in Embodiment 1.

Through the above steps, a semiconductor device of one embodiment of the present invention is formed.

In the semiconductor device described in this embodiment, at least one of the first semiconductor film and the second semiconductor film is an oxide semiconductor film. With the use of an oxide semiconductor film for the first semiconductor film or the second semiconductor film, the semiconductor device can have high field-effect mobility and operate at high speed.

By employing a structure in which the first transistor including the first semiconductor film and the second transistor including the second semiconductor film are stacked and have the gate electrode in common, the area of a region where the transistors are disposed can be reduced. Since the first transistor and the second transistor have the gate electrode in common, the number of manufacturing steps, materials, or the like of the transistors can be reduced.

The structures, methods, and the like described in this embodiment can be combined as appropriate with any of the structures, methods, and the like described in the other embodiments.

Embodiment 3

In this embodiment, a modification example of the semiconductor device illustrated in FIGS. 1A and 1B of Embodiment 1, or a modification example of the semiconductor device illustrated in FIGS. 4A and 4B of Embodiment 2 will be described with reference to FIGS. 7A and 7B. Note that portions similar to those in FIGS. 1A and 1B and FIGS. 4A and 4B are denoted by the same reference numerals, and description thereof is skipped.

Structural Example of Semiconductor Device
(Modification Example 2)

Figure 7A:
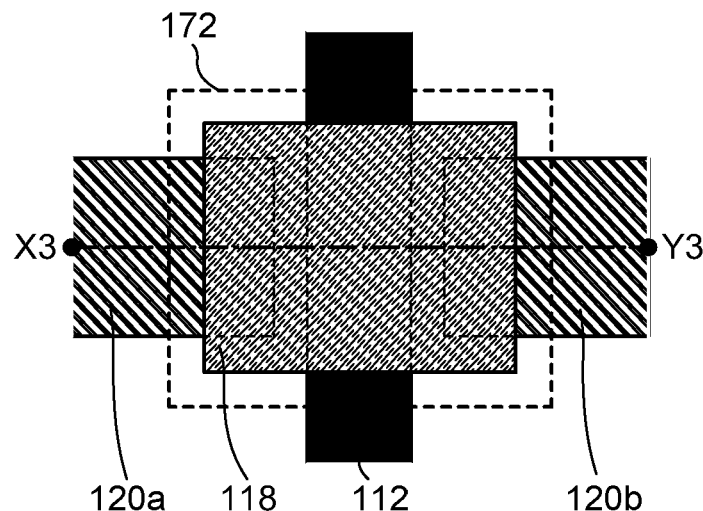
FIGS. 7A and 7B are a top view and a cross-sectional view illustrating one embodiment of a semiconductor device.
Figure 7B:
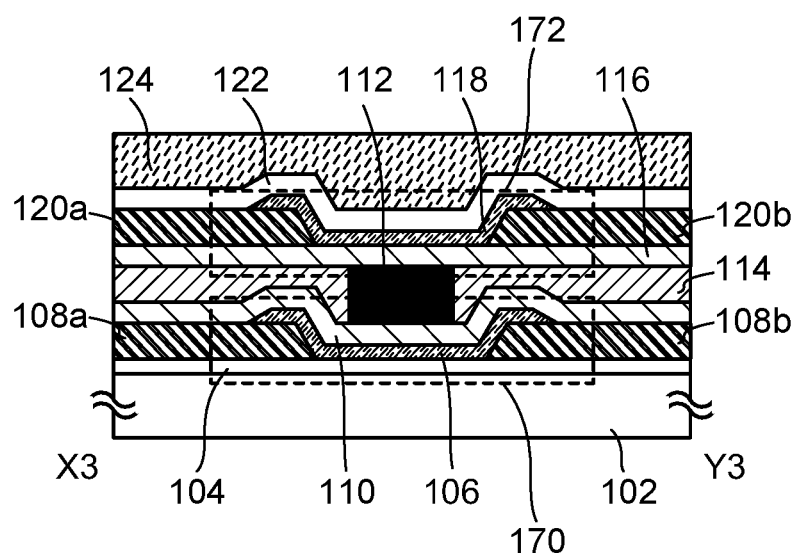

FIGS. 7A and 7B are a top view and a cross-sectional view, respectively, of a transistor as one embodiment of a semiconductor device. Note that FIG. 7A is a top view, and FIG. 7B is a cross-sectional view taken along line X3-Y3 in FIG. 7A. Note that in FIG. 7A, some components of the transistor (e.g., the first gate insulating film 110) are not illustrated for simplicity.

The semiconductor device illustrated in FIGS. 7A and 7B includes a first transistor 170 and a second transistor 172. The first transistor 170 includes the base insulating film 104 formed over the substrate 102; the first source electrode 108*a* and the first drain electrode 108*b* formed over the base insulating film 104; the first semiconductor film 106 formed over the first source electrode 108*a* and the first drain electrode 108*b*; the first gate insulating film 110 formed over the first semiconductor film 106; and the gate electrode 112 which is in contact with the first gate insulating film 110 and overlaps with the first semiconductor film 106. The second transistor 172 includes the second gate insulating film 116 formed over the gate electrode 112; the second source electrode 120*a* and the second drain electrode 120*b* formed over the second gate insulating film 116; and the second semiconductor film 118 which is in contact with the second gate insulating film 116, overlaps with the gate electrode 112, and is electrically connected to the second source electrode 120*a* and the second drain electrode 120*b*. The first transistor 170 and the second transistor 172 are stacked.

The semiconductor device illustrated in FIGS. 7A and 7B may include the interlayer insulating film 114 between the first transistor 170 and the second transistor 172, and may include the insulating film 122 and the planarization insulating film 124 over the second transistor 172.

Note that at least one of the first semiconductor film 106 and the second semiconductor film 118 is an oxide semiconductor film. With the use of an oxide semiconductor film for the first semiconductor film 106 or the second semiconductor film 118, the semiconductor device can have high field-effect mobility and operate at high speed.

In this embodiment, a structure in which an oxide semiconductor film is used for each of the first semiconductor film 106 and the second semiconductor film 118 is employed. In the case where the first semiconductor film 106 and the second semiconductor film 118 are preferably equivalent in electrical characteristics, it is effective to use an oxide semiconductor film for each of the first semiconductor film 106 and the second semiconductor film 118 in this manner.

The first transistor 170 and the second transistor 172 have the gate electrode 112 in common. That is, the first transistor 170 is a top-gate transistor in which the gate electrode 112 is provided over the first semiconductor film 106 with the first gate insulating film 110 therebetween, and the second transistor 172 is a bottom-gate transistor in which the second semiconductor film 118 is provided over the gate electrode 112 with the second gate insulating film 116 therebetween. By employing a structure in which the first transistor 170 and the second transistor 172 are stacked and have the gate electrode 112 in common, the area of a region where the transistors are disposed can be reduced. Since the first transistor 170 and the second transistor 172 have the gate electrode 112 in common, the number of manufacturing steps, materials, or the like of the transistors can be reduced.

The semiconductor device including the first transistor 170 and the second transistor 172 in this embodiment is different from the semiconductor device including the first transistor 150 and the second transistor 152 in Embodiment 1 in the structures of the transistors.

Specifically, the first transistor 170 in this embodiment is different from the first transistor 150 in the positions of the first source electrode 108*a* and the first drain electrode 108*b* with respect to the first semiconductor film 106. In this embodiment, a so-called bottom-contact transistor is employed in which the first semiconductor film 106 is formed over the first source electrode 108*a* and the first drain electrode 108*b*, and is electrically connected to the first source electrode 108*a* and the first drain electrode 108*b* on part of the lower surface of the first semiconductor film 106.

The second transistor 172 in this embodiment is different from the second transistor 152 in the positions of the second source electrode 120a and the second drain electrode 120b with respect to the second semiconductor film 118. In this embodiment, a so-called bottom-contact transistor is employed in which the second semiconductor film 118 is formed over the second source electrode 120a and the second drain electrode 120b, and is electrically connected to the second source electrode 120a and the second drain electrode 120b on part of the lower surface of the second semiconductor film 118.

The other components can have structures similar to those in the semiconductor device described in Embodiment 1 or the semiconductor device described in Embodiment 2.

The first transistor 170 and the second transistor 172 can be manufactured in such a manner that the order of forming the first semiconductor film 106 and the first source electrode 108a and the first drain electrode 108b, and the order of forming the second semiconductor film 118 and the second source electrode 120a and the second drain electrode 120b are reversed from those in the semiconductor device described in Embodiment 1.

In the semiconductor device described in this embodiment, at least one of the first semiconductor film and the second semiconductor film is an oxide semiconductor film. With the use of an oxide semiconductor film for the first semiconductor film or the second semiconductor film, the semiconductor device can have high field-effect mobility and operate at high speed.

By employing a structure in which the first transistor including the first semiconductor film and the second transistor including the second semiconductor film are stacked and have the gate electrode in common, the area of a region where the transistors are disposed can be reduced. Since the first transistor and the second transistor have the gate electrode in common, the number of manufacturing steps, materials, or the like of the transistors can be reduced.

The structures, methods, and the like described in this embodiment can be combined as appropriate with any of the structures, methods, and the like described in the other embodiments.

Embodiment 4

In this embodiment, a modification example of the semiconductor device illustrated in FIGS. 4A and 4B of Embodiment 2 will be described with reference to FIGS. 8A and 8B. Note that portions similar to those in FIGS. 4A and 4B are denoted by the same reference numerals, and description thereof is skipped.

Structural Example of Semiconductor Device (Modification Example 3)

Figure 8A:
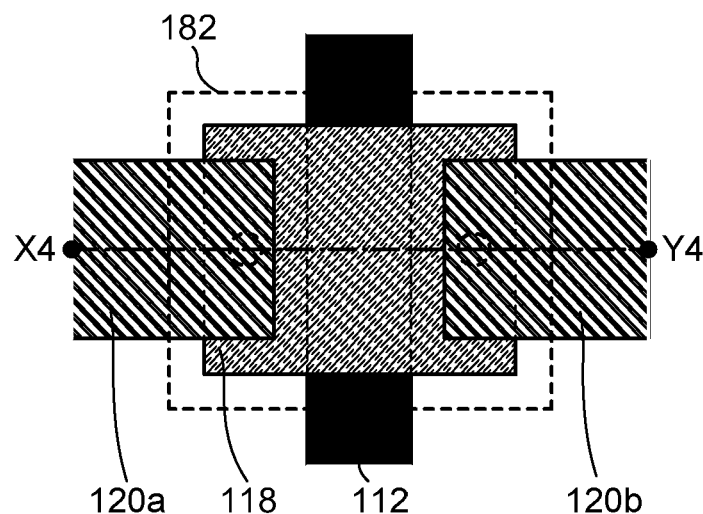
FIGS. 8A and 8B are a top view and a cross-sectional view illustrating one embodiment of a semiconductor device.
Figure 8B:
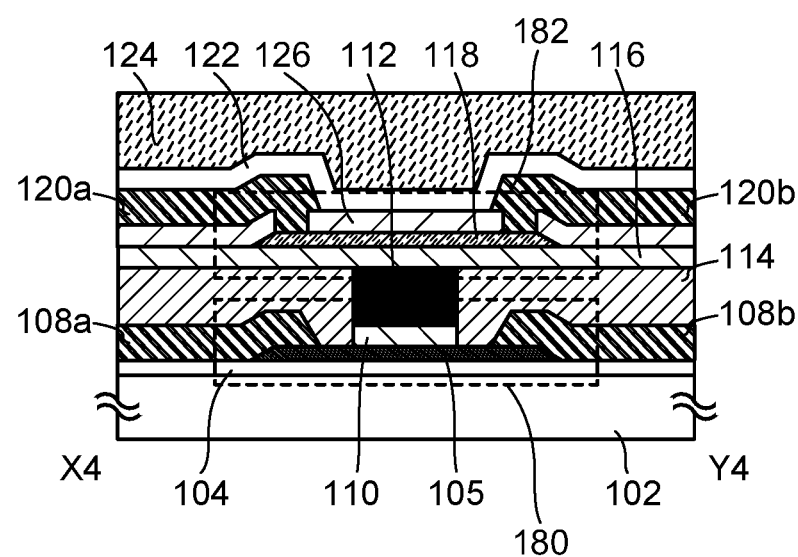

FIGS. 8A and 8B are a top view and a cross-sectional view, respectively, of a transistor as one embodiment of a semiconductor device. Note that FIG. 8A is a top view, and FIG. 8B is a cross-sectional view taken along line X4-Y4 in FIG. 8A. Note that in FIG. 8A, some components of the transistor (e.g., the first gate insulating film 110) are not illustrated for simplicity.

The semiconductor device illustrated in FIGS. 8A and 8B includes a first transistor 180 and a second transistor 182. The first transistor 180 includes the base insulating film 104 formed over the substrate 102; a first semiconductor film 105 formed over the base insulating film 104; the first source electrode 108a and the first drain electrode 108b formed over the first semiconductor film 105; the first gate insulating film 110 formed over the first semiconductor film 105; and the gate electrode 112 which is in contact with the first gate insulating film 110 and overlaps with the first semiconductor film 105. The second transistor 182 includes the second gate insulating film 116 formed over the gate electrode 112; the second semiconductor film 118 which is in contact with the second gate insulating film 116 and overlaps with the gate electrode 112; the protective insulating film 126 formed over the second semiconductor film 118; and the second source electrode 120a and the second drain electrode 120b which are formed over the protective insulating film 126 and are electrically connected to the second semiconductor film 118. The first transistor 180 and the second transistor 182 are stacked.

The semiconductor device illustrated in FIGS. 8A and 8B may include the interlayer insulating film 114 between the first transistor 180 and the second transistor 182, and may include the insulating film 122 and the planarization insulating film 124 over the second transistor 182.

Note that in this embodiment, the first semiconductor film 105 is a semiconductor film other than an oxide semiconductor film, and the second semiconductor film 118 is an oxide semiconductor film. With the use of an oxide semiconductor film for the second semiconductor film 118, the semiconductor device can have high field-effect mobility and operate at high speed.

Although an oxide semiconductor film is used for the second semiconductor film in this embodiment, one embodiment of the present invention is not limited thereto. A structure in which an oxide semiconductor film is used for each of the first semiconductor film and the second semiconductor film described in any of the above embodiments, or a structure in which an oxide semiconductor film is used for the first semiconductor film and a semiconductor film other than an oxide semiconductor film is used for the second semiconductor film may be employed.

The first transistor 180 and the second transistor 182 have the gate electrode 112 in common. That is, the first transistor 180 is a top-gate transistor in which the gate electrode 112 is provided over the first semiconductor film 105 with the first gate insulating film 110 therebetween, and the second transistor 182 is a bottom-gate transistor in which the second semiconductor film 118 is provided over the gate electrode 112 with the second gate insulating film 116 therebetween. By employing a structure in which the first transistor 180 and the second transistor 182 are stacked and have the gate electrode 112 in common, the area of a region where the transistors are disposed can be reduced. Since the first transistor 180 and the second transistor 182 have the gate electrode 112 in common, the number of manufacturing steps, materials, or the like of the transistors can be reduced.

The semiconductor device including the first transistor 180 and the second transistor 182 in this embodiment is different from the semiconductor device including the first transistor 160 and the second transistor 162 in Embodiment 2 in the structure of the first transistor.

Specifically, the first transistor 180 in this embodiment is different from the first transistor 160 in the material for the first semiconductor film. In this embodiment, the first semiconductor film 105 is a silicon film.

The first semiconductor film 105 is formed using a semiconductor film other than an oxide semiconductor film, and for example, can be formed using a silicon film. For the silicon film, amorphous silicon, single crystal silicon, polycrystalline silicon, microcrystalline silicon (also referred to as microcrystal silicon) including a crystal region in amorphous silicon, or the like can be used.

In the case where a silicon film is used as the first semiconductor film 105, the silicon film can be formed by a PE-CVD method or the like. After the gate electrode 112 is formed, impurities may be injected into the first semiconductor film 105 with the first gate insulating film 110 and the gate electrode 112 used as masks. As the impurities injected into the first semiconductor film 105, impurity elements imparting p-type conductivity such as boron, aluminum, and gallium, or impurity elements imparting n-type conductivity such as phosphorus and arsenic can be used.

The structures, methods, and the like described in this embodiment can be combined as appropriate with any of the structures, methods, and the like described in the other embodiments.

Embodiment 5

In this embodiment, a device having a display function (also referred to as display device) that can be manufactured using the semiconductor device including transistors in any of Embodiments 1 to 4 will be described with reference to FIGS. 9A to 9C and FIGS. 10A and 10B. Further, part or the whole of a driver circuit driving the display device is formed over the same substrate as a pixel portion with the use of the semiconductor device including transistors in any of Embodiments 1 to 4, whereby a system-on-panel can be obtained.

Figure 9A:
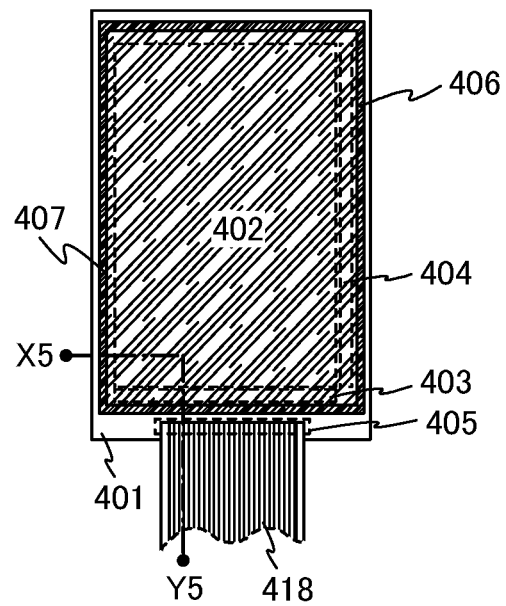
FIGS. 9A to 9C are a top view and structural views of pixels illustrating embodiments of a display device.
Figure 9B:
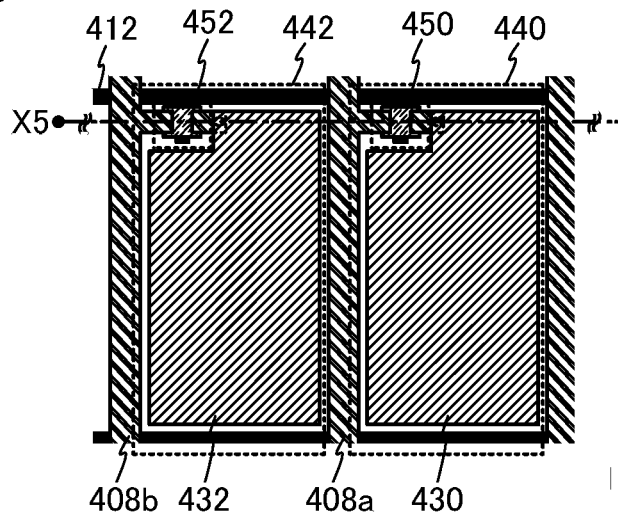
Figure 9C:
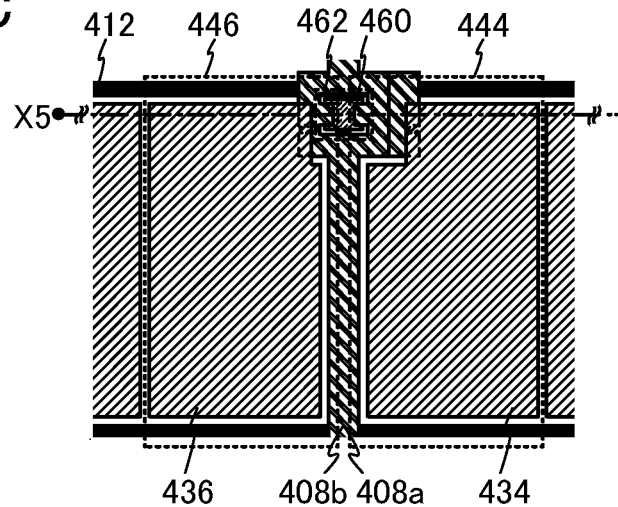

FIG. 9A is a top view of the system-on-panel including the pixel portion as one embodiment of the display device. FIG. 9B and FIG. 9C each illustrate a pixel structure that can be used for the pixel portion.

In FIG. 9A, a sealant 406 is provided so as to surround a pixel portion 402, a source driver circuit portion 403, and a gate driver circuit portion 404 which are provided over a first substrate 401. The second substrate 407 is provided over the pixel portion 402, the source driver circuit portion 403, and the gate driver circuit portion 404. Thus, the pixel portion 402, the source driver circuit portion 403, and the gate driver circuit portion 404 are sealed together with a display element by the first substrate 401, the sealant 406, and the second substrate 407.

In FIG. 9A, a flexible printed circuit (FPC) terminal portion 405 which is electrically connected to the pixel portion 402, the source driver circuit portion 403, and the gate driver circuit portion 404 is provided in a region over the first substrate 401 that is different from the region surrounded by the sealant 406. An FPC 418 is connected to the FPC terminal portion 405. Signals and potentials applied to the pixel portion 402, the source driver circuit portion 403, and the gate driver circuit portion 404 are supplied through the FPC 418.

In FIG. 9A, an example in which the source driver circuit portion 403 and the gate driver circuit portion 404 are formed over the first substrate 401 where the pixel portion 402 is also formed is described; however, the structure is not limited thereto. For example, only the gate driver circuit portion 404 may be formed over the first substrate 401 or only the source driver circuit portion 403 may be formed over the first substrate 401. In this case, a substrate where a source driver circuit, a gate driver circuit, or the like is formed (e.g., a driver circuit substrate formed using a single crystal semiconductor film or a polycrystalline semiconductor film) may be mounted on the first substrate 401.

There is no particular limitation on the connection method of a separately formed driver circuit substrate; a chip on glass (COG) method, a wire bonding method, a tape automated bonding (TAB) method, or the like can be used.

In addition, the display device may include a panel in which a display element is sealed and a module in which an IC and the like including a controller are mounted on the panel.

Note that a display device in this specification means an image display device, a display device, or a light source (including a lighting device). Furthermore, the display device also includes the following modules in its category: a module to which a connector such as an FPC, a TAB tape, or a tape carrier package (TCP) is attached; a module having a TAB tape or a TCP at the tip of which a printed wiring board is provided; and a module in which a driver circuit substrate or an integrated circuit (IC) is directly mounted on a display element by a COG method.

In addition, the pixel portion 402, the source driver circuit portion 403, and the gate driver circuit portion 404 provided over the first substrate 401 each include a plurality of semiconductor devices including transistors to which the semiconductor devices including transistors in any of Embodiments 1 to 4 can be applied.

Here, specific pixel structures of the pixel portion 402 in the display device illustrated in FIG. 9A will be described with reference to FIGS. 9B and 9C.

FIGS. 9B and 9C are each a top view illustrating an example of a pixel structure that can be used for the pixel portion 402. In the pixel structures illustrated in FIGS. 9B and 9C, some components (e.g., a gate insulating film) are not illustrated in order to avoid complexity of the drawings.

In the pixel structure in FIG. 9B, one element controlling a pixel (also referred to as pixel switching element or pixel transistor) is provided for each pixel in the same plane. Two pixels are illustrated in FIG. 9B. The pixel structure in FIG. 9B is different from that in one embodiment of the present invention, and is an example of a general pixel structure.

A first pixel 440 and a second pixel 442 are formed in the pixel structure in FIG. 9B. The first pixel 440 includes a source line 408a, a gate line 412, a first pixel electrode 430, and a first transistor 450 controlling the first pixel electrode 430. The second pixel 442 includes a source line 408b, the gate line 412, a second pixel electrode 432, and a second transistor 452 controlling the second pixel electrode 432.

In the pixel structure illustrated in FIG. 9B, a region corresponding to the first pixel electrode 430 and the second pixel electrode 432 is a display region. The first transistor 450 has a switching function for the first pixel electrode 430 and thus can control the first pixel electrode 430. The second transistor 452 has a switching function for the second pixel electrode 432 and thus can control the second pixel electrode 432.

In the pixel structure in FIG. 9C, one element controlling a pixel (also referred to as pixel switching element or pixel transistor) is provided for each pixel so that elements for adjacent pixels are stacked. Two pixels are illustrated in FIG. 9C. The pixel structure in FIG. 9C is one embodiment of the present invention.

A first pixel 444 and a second pixel 446 are formed in the pixel structure in FIG. 9C. The first pixel 444 includes the source line 408a, the gate line 412, a first pixel electrode 434, and a first transistor 460 controlling the first pixel electrode 434. The second pixel 446 includes the source line 408b, the gate line 412, a second pixel electrode 436, and a second transistor 462 controlling the second pixel electrode 436.

In the pixel structure illustrated in FIG. 9C, a region corresponding to the first pixel electrode 434 and the second pixel electrode 436 is a display region. Note that in FIG. 9C, since the source line 408a and the source line 408b are stacked, they are shown in the same position in the top view; since the first transistor 460 and the second transistor 462 are stacked, they are shown in the same position in the top view. The first transistor 460 has a switching function for the first pixel electrode 434 and thus can control the first pixel electrode 434. The second transistor 462 has a switching function for the second pixel electrode 436 and thus can control the second pixel electrode 436.

By using the pixel structure in FIG. 9C for the pixel portion 402, the area of a region where the transistors are disposed can be reduced. Accordingly, the area of the pixel electrodes can be increased.

As the display element provided in the display device in FIG. 9A, a liquid crystal element (also referred to as liquid crystal display element) or a light-emitting element (also referred to as light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric effect, such as electronic ink, can be used.

Figure 10A:
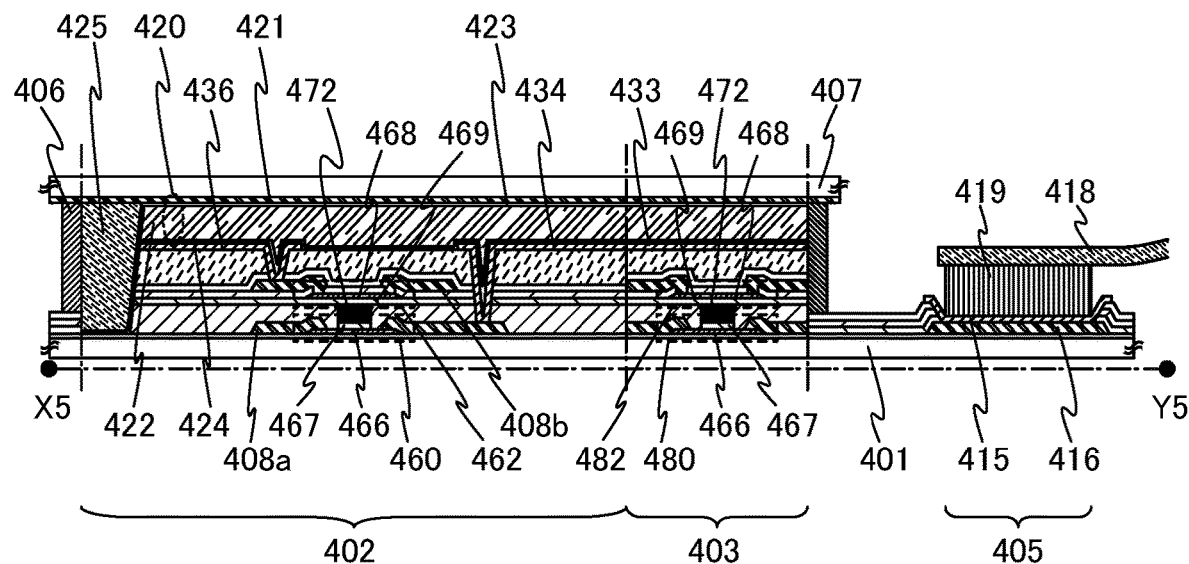
FIGS. 10A and 10B are cross-sectional views each illustrating one embodiment of a display device.
Figure 10B:
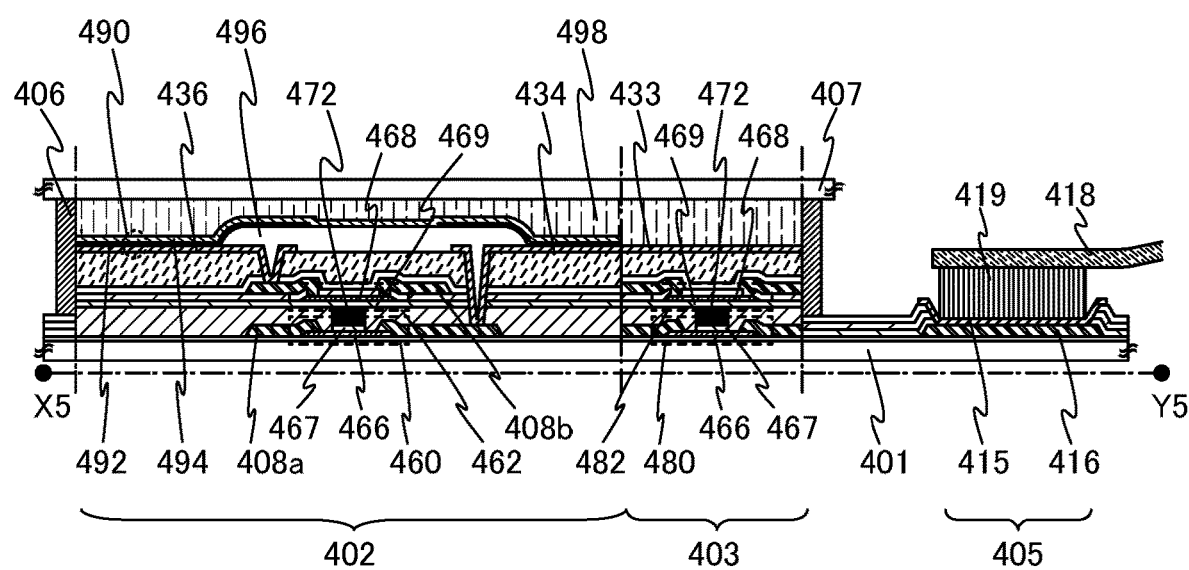

One embodiment of the display element provided in the display device in FIG. 9A will be described with reference to FIGS. 10A and 10B. FIGS. 10A and 10B are each a cross-sectional view of a display device taken along line X5-Y5 in FIG. 9A. Here, the pixel structure in FIG. 9C is used for the pixel portion 402 in FIG. 9A.

The display devices in FIGS. 10A and 10B include a connection terminal electrode 415 and a terminal electrode 416 in the FPC terminal portion 405 over the first substrate 401. The connection terminal electrode 415 and the terminal electrode 416 are electrically connected to a terminal of the FPC 418 through an anisotropic conductive film 419.

The connection terminal electrode 415 is formed through the same steps as a conductive film 433, the first pixel electrode 434, and the second pixel electrode 436. The terminal electrode 416 is formed through the same steps as a source electrode and a drain electrode of the first transistor 460.

Further, the pixel portion 402 and the source driver circuit portion 403 which are provided over the first substrate 401 include a plurality of transistors. As examples of the plurality of transistors, the first transistor 460 and the second transistor 462 included in the pixel portion 402, and a first transistor 480 and a second transistor 482 included in the source driver circuit portion 403 are illustrated in FIGS. 10A and 10B.

Although the first transistor 480 and the second transistor 482 are stacked in the source driver circuit portion 403 in this embodiment, one embodiment of the present invention is not limited thereto; for example, in a driver circuit including the source driver circuit portion, a structure including either the first transistor 480 or the second transistor 482 may be employed.

The first transistor 480 and the second transistor 482 included in the source driver circuit portion 403 can, for example, select and control the source lines connected to the pixels arranged in a matrix.

In this embodiment, a conductive film is not formed over the first transistor 460 or the second transistor 462 included in the pixel portion 402, and the conductive film 433 is formed over the first transistor 480 and the second transistor 482 included in the source driver circuit portion 403.

The conductive film 433 has a function of blocking an electric field from the outside, that is, preventing an external electric field (particularly, static electricity) from affecting the inside (a circuit including the first transistor 480 and the second transistor 482). A blocking function of the conductive film 433 can prevent fluctuation in the electrical characteristics of the first transistor 480 and the second transistor 482 due to an influence of an external electric field such as static electricity.

Note that in this embodiment, the first transistor 460 and the second transistor 462 included in the pixel portion 402 and the first transistor 480 and the second transistor 482 included in the source driver circuit portion 403 have the same size; however, one embodiment of the present invention is not limited thereto. The sizes (L/W) or the number of the transistors used in the pixel portion 402 and the source driver circuit portion 403 may vary as appropriate. The gate driver circuit portion 404 is not illustrated in FIGS. 10A and 10B; the gate driver circuit portion 404 can have a structure similar to that of the source driver circuit portion 403 although a portion to which the gate driver circuit portion 404 is connected, a connection method of the gate driver circuit portion 404, and the like are different from a portion to which the source driver circuit portion 403 is connected, a connection method of the source driver circuit portion 403, and the like, respectively.

In the display devices illustrated in FIGS. 10A and 10B, the first transistor 460 and the second transistor 462 in the pixel portion 402 include a first semiconductor film 466 and a second semiconductor film 468, respectively. Note that at least one of the first semiconductor film 466 and the second semiconductor film 468 is an oxide semiconductor film. With the use of an oxide semiconductor film for the first semiconductor film 466 or the second semiconductor film 468, the semiconductor device can have high field-effect mobility and operate at high speed. Note that in this embodiment, an oxide semiconductor film is used for each of the first semiconductor film 466 and the second semiconductor film 468.

The first transistor 460 and the second transistor 462 have the gate electrode 472 in common. That is, the first transistor 460 is a top-gate transistor in which the gate electrode 472 is provided over the first semiconductor film 466 with the first gate insulating film 467 therebetween, and the second transistor 462 is a bottom-gate transistor in which the second semiconductor film 468 is provided over the gate electrode 472 with the second gate insulating film 469 therebetween. By employing a structure in which the first transistor 460 and the second transistor 462 are stacked and have the gate electrode 472 in common, the area of a region where the transistors are disposed can be reduced. Since the first transistor 460 and the second transistor 462 have the gate electrode 472 in common, the number of manufacturing steps, materials, or the like of the transistors can be reduced. The number of the gate lines 412 connected to the gate electrodes 472 can also be reduced. Note that the first transistor 460 includes the source electrode connected to the source line 408a, and the second transistor 462 includes a source electrode connected to the source line 408b.

Further, in the display devices illustrated in FIGS. 10A and 10B, the first transistor 480 and the second transistor 482 in the source driver circuit portion 403 can have structures similar to those of the first transistor 460 and the second transistor 462 in the pixel portion 402.

Therefore, with the use of a semiconductor device including transistors according to one embodiment of the present invention, a high-resolution display device with improved aperture ratio can be provided.

The first transistor 460 and the second transistor 462 provided in the pixel portion 402 are electrically connected to a display element to form a display panel. A variety of display elements can be used as the display element as long as display can be performed.

The display device illustrated in FIG. 10A is an example of a liquid crystal display device including a liquid crystal element as a display element. In FIG. 10A, a liquid crystal element 420 as a display element includes the pixel electrodes (the first pixel electrode 434 and the second pixel electrode 436), a counter electrode 421, and a liquid crystal layer 422. Note that an alignment film 423 and an alignment film 424 are provided so that the liquid crystal layer 422 is interposed therebetween. The counter electrode 421 is provided on the second substrate 407 side, and the pixel electrodes (the first pixel electrode 434 and the second pixel electrode 436) and the counter electrode 421 are stacked with the liquid crystal layer 422 interposed therebetween.

A spacer 425 is a columnar spacer obtained by selective etching of an insulating film and is provided in order to control the thickness of the liquid crystal layer 422 (cell gap). Alternatively, a spherical spacer may be used.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, in the case of employing a horizontal electric field mode, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time, and has optical isotropy, which makes the alignment process unneeded and the viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, the liquid crystal display device can be manufactured with improved productivity. A transistor including an oxide semiconductor film has a possibility that the electrical characteristics of the transistor may vary significantly by the influence of static electricity and deviate from the designed range. Therefore, it is more effective to use a liquid crystal material exhibiting a blue phase for a liquid crystal display device including a transistor that includes an oxide semiconductor film.

The specific resistivity of the liquid crystal material is higher than or equal to $1\times10^{9}\Omega\cdot cm$, preferably higher than or equal to $1\times10^{11}\Omega\cdot cm$, further preferably higher than or equal to $1\times10^{12}\Omega\cdot cm$. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of the transistor or the like. For example, by using a transistor including an oxide semiconductor film which is highly purified and in which formation of an oxygen vacancy is suppressed, it is enough to provide a storage capacitor having a capacitance that is ⅓ or less, preferably ⅕ or less of liquid crystal capacitance of each pixel. In the transistor including an oxide semiconductor film which is highly purified and in which formation of an oxygen vacancy is suppressed, the current in an off state (off-state current) can be made small. Accordingly, an electric signal such as an image signal can be held for a longer period, and a writing interval can be set longer in an on state. Accordingly, the frequency of refresh operation can be reduced, which leads to an effect of suppressing power consumption.

The transistor used in this embodiment, which includes an oxide semiconductor film which is highly purified and in which formation of an oxygen vacancy is suppressed, can have high field-effect mobility and thus can operate at high speed. For example, when such a transistor that can operate at high speed is used for a liquid crystal display device, a switching transistor in a pixel portion and a driver transistor in a driver circuit portion can be formed over one substrate. That is, since a semiconductor device formed using a silicon wafer or the like is not additionally needed as a driver circuit, the number of components of the semiconductor device can be reduced. In addition, by using a transistor that can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, and the like can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a method for display in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

To extract light from the light-emitting element, at least one of the pair of electrodes has a light-transmitting property. A transistor and a light-emitting element are formed over a substrate. The light-emitting element can employ any of the following emission structures: a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side.

The display device illustrated in FIG. 10B is an example of a display device including a light-emitting element as a display element. A light-emitting element 490 as a display element is electrically connected to the transistor (the first transistor 460 or the second transistor 462) provided in the pixel portion 402. Here, the light-emitting element 490 has a layered structure of the pixel electrode (the first pixel electrode 434 or the second pixel electrode 436), an electroluminescent layer 492, and an upper electrode 494; however, the structure of the light-emitting element 490 is not limited thereto. The structure of the light-emitting element 490 can be changed as appropriate depending on the direction in which light is extracted from the light-emitting element 490, or the like.

A partition wall 496 is formed using an organic insulating material or an inorganic insulating material. It is particularly preferable that the partition wall 496 be formed using a photosensitive resin material to have an opening on each of the pixel electrodes (the first pixel electrode 434 and the second pixel electrode 436) so that a sidewall of the opening is formed as a tilted surface with continuous curvature.

The electroluminescent layer 492 may be formed with a single layer or a plurality of layers stacked.

A protective film may be formed over the upper electrode 494 and the partition wall 496 in order to prevent oxygen, hydrogen, moisture, carbon dioxide, or the like from entering the light-emitting element 490. As the protective film, a silicon nitride film, a silicon nitride oxide film, a DLC film, or the like can be formed. In addition, in a space which is formed with the first substrate 401, the second substrate 407, and the sealant 406, a filler 498 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 498, an ultraviolet curable resin or a thermosetting resin can be used as well as an inert gas such as nitrogen or argon. For example, polyvinyl chloride (PVC), an acrylic-based resin, a polyimide-based resin, an epoxy-based resin, a silicone-based resin, polyvinyl butyral (PVB), or ethylene vinyl acetate (EVA) can be used. For example, nitrogen may be used for the filler 498.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Note that in FIGS. 10A and 10B, a flexible substrate as well as a glass substrate can be used as the first substrate 401 and the second substrate 407. For example, a plastic substrate having a light-transmitting property or the like can be used. As plastic, a fiberglass-reinforced plastics (FRP) plate, a polyvinyl fluoride (PVF) film, a polyester film, or an acrylic-based resin film can be used. In addition, a sheet with a structure in which an aluminum foil is interposed between PVF films or polyester films can be used.

As described above, by using the semiconductor device including transistors in any of Embodiments 1 to 4, a display device having a variety of functions can be provided.

This embodiment can be implemented in appropriate combination with any of the structures described in the other embodiments.

Embodiment 6

A semiconductor device disclosed in this specification can be applied to a variety of electronic devices (including a game machine). Examples of the electronic devices are a television set (also referred to as television or television receiver), a monitor of a computer or the like, a camera such as a digital camera or a digital video camera, a digital photo frame, a mobile phone (also referred to as mobile telephone or mobile phone device), a portable game console, a portable digital assistant (PDA), a portable terminal (including a smart phone, a tablet PC, and the like), an audio reproducing device, a large-sized game machine such as a pachinko machine, and the like. Examples of electronic devices each including the semiconductor device described in any of the above embodiments will be described with reference to FIGS. 11A to 11F and FIGS. 12A-1 to 12A-3 and 12B.

Figure 11A:
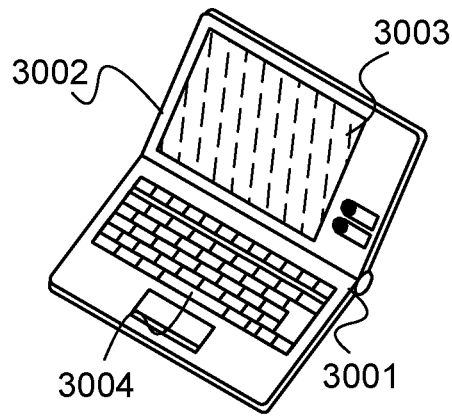
FIGS. 11A to 11F illustrate electronic devices.

FIG. 11A illustrates a laptop personal computer, which includes a main body 3001, a housing 3002, a display portion 3003, a keyboard 3004, and the like. The semiconductor device described in any of the above embodiments is applied to the display portion 3003, whereby a laptop personal computer including a high-resolution display device can be provided.

Figure 11B:
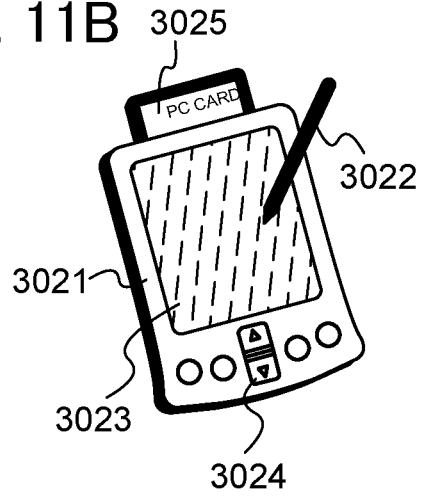

FIG. 11B illustrates a personal digital assistant (PDA), which includes a main body 3021 provided with a display portion 3023, an external interface 3025, operation buttons 3024, and the like. A stylus 3022 is provided as an accessory for operation. The semiconductor device described in any of the above embodiments is applied to the display portion 3023, whereby a personal digital assistant (PDA) including a high-resolution display device can be provided.

Figure 11C:
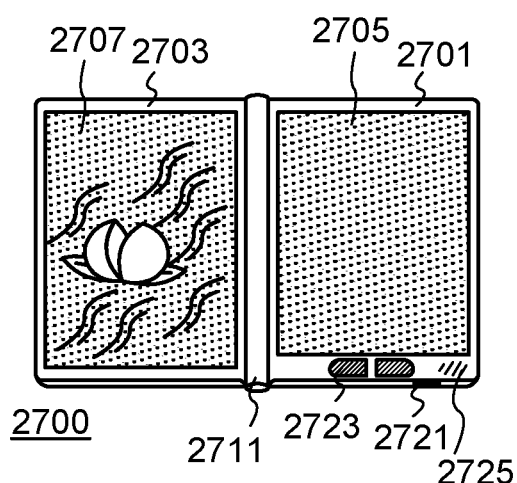

FIG. 11C illustrates an example of an electronic book reader. For example, an electronic book reader 2700 includes two housings 2701 and 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 11C) and images can be displayed on a display portion on the left side (the display portion 2707 in FIG. 11C). The semiconductor device described in any of the above embodiments is applied to the display portion 2705 and the display portion 2707, whereby an electronic book reader including a high-resolution display device can be provided. In the case of using a transflective or reflective liquid crystal display device as the display portion 2705, the electronic book reader may be used in a comparatively bright environment; therefore, a solar cell may be provided so that power generation by the solar cell and charge by a battery can be performed. When a lithium ion battery is used as the battery, there are advantages of downsizing and the like.

Further, FIG. 11C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 11D:
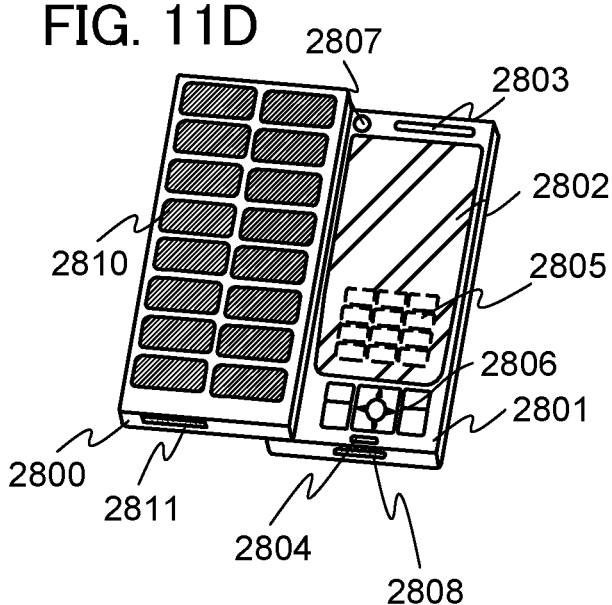

FIG. 11D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801. The semiconductor device described in any of the above embodiments is applied to the display panel 2802, whereby a mobile phone including a high-resolution display device can be provided.

Further, the display panel 2802 is provided with a touch panel. A plurality of operation keys 2805 displayed as images is shown by dashed lines in FIG. 11D. Note that a boosting circuit by which a voltage output from the solar cell 2810 is increased to be sufficiently high for each circuit is also included.

In the display panel 2802, the display direction can be appropriately changed depending on a usage pattern. Further, the camera lens 2807 is provided on the same surface as the display panel 2802, and thus it can be used as a video phone. The speaker 2803 and the microphone 2804 can be used for videophone calls, recording and playing sound, and the like as well as voice calls. Further, the housings 2800 and 2801 in a state where they are developed as illustrated in FIG. 11D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be transferred.

Further, in addition to the above functions, an infrared communication function, a television reception function, or the like may be provided.

Figure 11E:
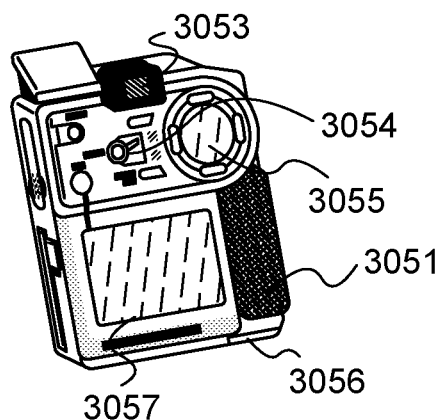

FIG. 11E illustrates a digital video camera which includes a main body 3051, a display portion A 3057, an eyepiece 3053, an operation switch 3054, a display portion B 3055, a battery 3056, and the like. The semiconductor device described in any of the above embodiments is applied to the display portion A 3057 and the display portion B 3055, whereby a digital video camera including a high-resolution display device can be provided.

Figure 11F:
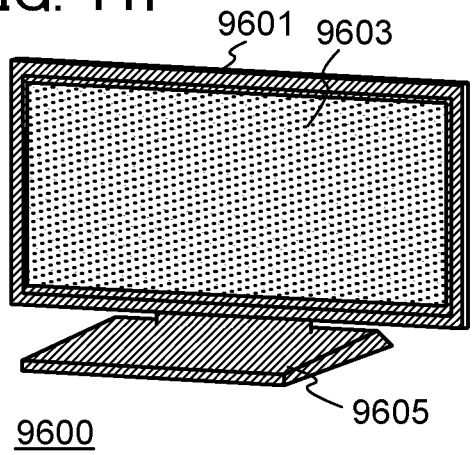

FIG. 11F illustrates an example of a television set. In a television set 9600, a display portion 9603 is incorporated in a housing 9601. The display portion 9603 can display images. Here, the housing 9601 is supported by a stand 9605. The semiconductor device described in any of the above embodiments is applied to the display portion 9603, whereby a television set including a high-resolution display device can be provided.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

FIGS. 12A-1 to 12A-3 and 12B illustrate examples of a tablet terminal. FIGS. 12A-1 to 12A-3 illustrate a tablet terminal 5000. FIG. 12B illustrates a tablet terminal 6000.

FIGS. 12A-1, 12A-2, and 12A-3 are a front view, a side view, and a rear view of the tablet terminal 5000, respectively. FIG. 12B is a front view of the tablet terminal 6000.

The tablet terminal 5000 includes a housing 5001, a display portion 5003, a power button 5005, a front camera 5007, a rear camera 5009, a first external connection terminal 5011, a second external connection terminal 5013, and the like.

In addition, the display portion 5003 is incorporated in the housing 5001 and can be used as a touch panel. For example, e-mailing or schedule management can be performed by touching an icon 5015 and the like on the display portion 5003. Further, the front camera 5007 is incorporated in the front side of the housing 5001, whereby an image on the user's side can be taken. The rear camera 5009 is incorporated in the rear side of the housing 5001, whereby an image on the opposite side of the user can be taken. Further, the housing 5001 includes the first external connection terminal 5011 and the second external connection terminal 5013. Sound can be output to an earphone or the like through the first external connection terminal 5011, and data can be moved through the second external connection terminal 5013, for example.

The tablet terminal 6000 in FIG. 12B includes a first housing 6001, a second housing 6003, a hinge portion 6005, a first display portion 6007, a second display portion 6009, a power button 6011, a first camera 6013, a second camera 6015, and the like.

The first display portion 6007 is incorporated in the first housing 6001. The second display portion 6009 is incorporated in the second housing 6003. For example, the first display portion 6007 and the second display portion 6009 are used as a display panel and a touch panel, respectively. The user can select images, enter characters, and so on by touching an icon 6019 displayed on the second display portion 6009 or a keyboard 6021 (actually, a keyboard image displayed on the second display portion 6009) while looking at a text icon 6017 displayed on the first display portion 6007. Alternatively, the first display portion 6007 and the second display portion 6009 may be a touch panel and a display panel, respectively, or the first display portion 6007 and the second display portion 6009 may be touch panels.

The first housing 6001 and the second housing 6003 are connected to each other and open and close on the hinge portion 6005. With this structure, when the first display portion 6007 incorporated in the first housing 6001 and the second display portion 6009 incorporated in the second housing 6003 face each other in carrying the tablet terminal 6000, the surfaces of the first display portion 6007 and the second display portion 6009 (e.g., plastic substrates) can be protected, which is preferable.

Alternatively, the first housing 6001 and the second housing 6003 may be separated by the hinge portion 6005 (so-called convertible type). Thus, the application range of the tablet terminal 6000 can be extended; for example, the first housing 6001 is used in a vertical orientation and the second housing 6003 is used in a horizontal orientation.

Further, with the first camera 6013 and the second camera 6015, 3D images can be taken.

The tablet terminal 5000 and the tablet terminal 6000 may send and receive data wirelessly. For example, through wireless internet connection, desired data can be purchased and downloaded.

The tablet terminals 5000 and 6000 can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs). A detector such as a photodetector capable of optimizing display luminance in accordance with the amount of outside light or a sensor for detecting inclination, like a gyroscope or an acceleration sensor, can be included.

The semiconductor device described in any of the above embodiments is applied to the display portion 5003 of the tablet terminal 5000, the first display portion 6007 of the tablet terminal 6000, and/or the second display portion 6009 of the tablet terminal 6000, whereby a tablet terminal including a high-resolution display device can be provided.

This embodiment can be implemented in appropriate combination with any of the structures described in the other embodiments.

This application is based on Japanese Patent Application serial no. 2011-273413 filed with Japan Patent Office on Dec. 14, 2011, the entire contents of which are hereby incorporated by reference.

What is claimed is:

1. A display device comprising:
   a substrate;
   a pixel portion over the substrate; and
   a driver circuit over the substrate, the driver circuit comprising:
      a first transistor comprising:
         an oxide semiconductor layer comprising a channel formation region;
         a source electrode in contact with the oxide semiconductor layer;
         a drain electrode in contact with the oxide semiconductor layer;
         a gate electrode overlapping with the channel formation region of the oxide semiconductor layer; and
         a gate insulating layer between the oxide semiconductor layer and the gate electrode;
      a first insulating layer in contact with a side surface of the gate electrode and, a top surface of the source electrode, and a top surface of the drain electrode; and
      a second transistor comprising:
         a polycrystalline silicon layer comprising a channel formation region; and
         a second insulating layer between the polycrystalline silicon layer and the first insulating layer,
   wherein the channel formation region of the first transistor and the channel formation region of the second transistor overlap each other.

2. The display device according to claim 1, wherein the first transistor is electrically connected to the second transistor.

3. The display device according to claim 1, wherein the gate electrode is in contact with the second insulating layer.

4. The display device according to claim 1, wherein the gate electrode comprises copper.

5. The display device according to claim 1, wherein the oxide semiconductor layer comprises indium, gallium, and zinc.

6. The display device according to claim 1, wherein the oxide semiconductor layer comprises a crystal part.

7. A display device comprising:
a substrate;
a driver circuit over the substrate; and
a pixel portion over the substrate, the pixel portion comprising:
- a first transistor comprising an oxide semiconductor layer comprising a channel formation region;
- a second transistor comprising a polycrystalline silicon layer comprising a channel formation region;
- a first insulating layer over the polycrystalline silicon layer, wherein the oxide semiconductor layer is located over the first insulating layer;
- a second insulating layer over the oxide semiconductor layer and the polycrystalline silicon layer;
- a pixel electrode over the second insulating layer;
- a third insulating layer over the pixel electrode, wherein the third insulating layer overlaps with the oxide semiconductor layer and the polycrystalline silicon layer; and
- an electroluminescent layer over the third insulating layer and the pixel electrode, wherein a conductive layer is located over the polycrystalline silicon layer and functions as a gate electrode of the second transistor, and
wherein the conductive layer is located below the oxide semiconductor layer and functions as a gate electrode of the first transistor.

8. The display device according to claim 7, wherein the first transistor is electrically connected to the second transistor.

9. The display device according to claim 7, wherein each of the gate electrode of the first transistor and the gate electrode of the second transistor comprises copper.

10. The display device according to claim 7, wherein the oxide semiconductor layer comprises indium, gallium, and zinc.

11. The display device according to claim 7, wherein the oxide semiconductor layer comprises a crystal part.

12. The display device according to claim 7, wherein the channel formation region of the first transistor and the channel formation region of the second transistor overlap each other.

13. A display device comprising:
a substrate;
a driver circuit over the substrate; and
a pixel portion over the substrate, the pixel portion comprising:
- a first transistor comprising an oxide semiconductor layer comprising a channel formation region;
- a second transistor comprising a polycrystalline silicon layer comprising a channel formation region;
- a first insulating layer over the polycrystalline silicon layer, wherein the oxide semiconductor layer is located over the first insulating layer;
- a second insulating layer over the oxide semiconductor layer and the polycrystalline silicon layer; and
- a pixel electrode over the second insulating layer, wherein the pixel electrode is electrically connected to one of a source electrode and a drain electrode of the second transistor,
wherein a conductive layer is located over the polycrystalline silicon layer and functions as a gate electrode of the second transistor, and
wherein the conductive layer is located below the oxide semiconductor layer and functions as a gate electrode of the first transistor.

14. The display device according to claim 13, wherein the first transistor is electrically connected to the second transistor.

15. The display device according to claim 13, wherein each of the gate electrode of the first transistor and the gate electrode of the second transistor comprises copper.

16. The display device according to claim 13, wherein the oxide semiconductor layer comprises indium, gallium, and zinc.

17. The display device according to claim 13, wherein the oxide semiconductor layer comprises a crystal part.

18. The display device according to claim 13, wherein the channel formation region of the first transistor and the channel formation region of the second transistor overlap each other.

19. The display device according to claim 13, wherein a source electrode and a drain electrode of the first transistor do not overlap the gate electrode of the second transistor.

* * * * *